(12) United States Patent
Kikuchi

(10) Patent No.: US 9,257,464 B2
(45) Date of Patent: Feb. 9, 2016

(54) SOLID-STATE IMAGE DEVICE, METHOD OF FABRICATING THE SAME, AND ELECTRONIC APPARATUS

(71) Applicant: Sony Corporation, Tokyo (JP)

(72) Inventor: Yoshiaki Kikuchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 326 days.

(21) Appl. No.: 13/855,018

(22) Filed: Apr. 2, 2013

(65) Prior Publication Data

US 2013/0264469 A1  Oct. 10, 2013

(30) Foreign Application Priority Data

Apr. 4, 2012 (JP) ................................. 2012-085602

(51) Int. Cl.
*H01L 27/146* (2006.01)
*H01L 31/18* (2006.01)

(52) U.S. Cl.
CPC .... *H01L 27/14607* (2013.01); *H01L 27/14605* (2013.01); *H01L 31/18* (2013.01); *H01L 27/14609* (2013.01); *H01L 27/14627* (2013.01)

(58) Field of Classification Search
CPC ... H01L 27/14607; H01L 27/00; H01L 31/18; H01L 27/14605; H01L 27/14609
USPC ......................................... 250/208.1; 438/57
See application file for complete search history.

(56) References Cited

U.S. PATENT DOCUMENTS

| | | | |
|---|---|---|---|
| 7,098,108 B1 * | 8/2006 | Zeng ............................. | 438/268 |
| 2005/0145883 A1 * | 7/2005 | Beach et al. .................. | 257/194 |
| 2006/0079024 A1 * | 4/2006 | Akram .......................... | 438/110 |
| 2007/0042549 A1 * | 2/2007 | Zeng ............................. | 438/268 |

FOREIGN PATENT DOCUMENTS

JP        2011-155248        8/2011

* cited by examiner

*Primary Examiner* — Seung C Sohn
(74) *Attorney, Agent, or Firm* — Hazuki International, LLC

(57) ABSTRACT

There is provided a solid-state image device, including a semiconductor substrate, a circuit formed on a first face of the semiconductor substrate, a grid pattern provided on a second face of the semiconductor substrate, and a semiconductor layer formed within the grid pattern and having a shape whose cross-sectional surface area in a plane parallel to a surface of the semiconductor substrate decreases with increasing distance from the semiconductor substrate.

13 Claims, 19 Drawing Sheets

SOLID-STATE IMAGE DEVICE, METHOD OF FABRICATING THE SAME, AND ELECTRONIC APPARATUS

BACKGROUND

The present technology relates to a solid-state image device, a method of fabricating the same, and to an electronic apparatus equipped with the solid-state image device.

In front-illuminated solid-state image devices, there is proposed a configuration in which faceted $Si_{1-x}Ge_x$ (where $0<x<1$) is grown onto a photodiode (PD) by selective epitaxial growth (see JP 2011-155248A, for example). With such a configuration, it is possible to improve the light-condensing properties and the pixel sensitivity, mainly in the red and infrared regions, of a solid-state image device.

In addition, at present a back-illuminated solid-state image device has been proposed in order to improve pixel sensitivity.

SUMMARY

As described above, there is demand for improved pixel sensitivity in a solid-state image device.

An embodiment according to the present technology provides a solid-state image device with improved pixel sensitivity, a method of fabricating the solid-state image device, and an electronic apparatus.

A solid-state image device according to an embodiment of the present technology is equipped with a semiconductor substrate, a circuit formed on a first face of the semiconductor substrate, and a grid pattern provided on a second face of the semiconductor substrate. Additionally, there is provided a semiconductor layer formed within the grid pattern and having a shape whose cross-sectional surface area in a plane parallel to a surface of the semiconductor substrate decreases with increasing distance from the semiconductor substrate.

Also, an electronic apparatus according to an embodiment of the present technology is equipped with the solid-state image device and a signal processing circuit that processes an output signal from the solid-state image device.

A method of fabricating a solid-state image device according to an embodiment of the present technology includes forming a circuit on a first face of a semiconductor substrate, and forming a grid pattern on a second face of the semiconductor substrate. Additionally, the method includes epitaxially growing a semiconductor layer within the grid pattern, the semiconductor layer having a shape whose cross-sectional surface area in a plane parallel to a surface of the semiconductor substrate decreases with increasing distance from the semiconductor substrate.

According to a solid-state image device in accordance with an embodiment of the present technology, a semiconductor layer formed on a second face of a semiconductor substrate has a shape whose cross-sectional surface area in a plane parallel to a surface of the semiconductor substrate decreases with increasing distance from the semiconductor substrate, thus improving the light-condensing properties. For this reason, pixel sensitivity is improved in the solid-state image device, as well as in an electronic apparatus equipped with the solid-state image device.

In addition, according to a method of fabricating a solid-state image device in accordance with an embodiment of the present technology, a semiconductor layer is epitaxially grown on a second face of a semiconductor substrate. Since the semiconductor layer has a shape whose cross-sectional surface area in a plane parallel to a surface of the semiconductor substrate decreases with increasing distance from the semiconductor substrate, the light-condensing properties are improved. For this reason, it is possible to fabricate a solid-state image device with improved pixel sensitivity.

According to an embodiment of the present technology, it is possible to provide a solid-state image device with improved pixel sensitivity, a method of fabricating such a solid-state image device, and an electronic apparatus.

BRIEF DESCRIPTION OF THE DRAWINGS

FIG. 3A is a cross-section view illustrating a configuration of a solid-state image device according to the first embodiment, while FIG. 3B is a partial enlarged view of the portion B illustrated in FIG. 3A;

FIG. 15A is a cross-section view illustrating a configuration of peripheral circuits in a solid-state image device of the related art, while FIGS. 15B and 15C are cross-section views illustrating a configuration of peripheral circuits in a solid-state image device according to the first embodiment;

FIG. 16A is a cross-section view illustrating a configuration of a pixel array in a solid-state image device according to a modification of the first embodiment, while FIG. 16B is a cross-section view illustrating a configuration of peripheral circuits in a solid-state image device according to a modification of the first embodiment;

DETAILED DESCRIPTION OF THE EMBODIMENT(S)

Figure 1:
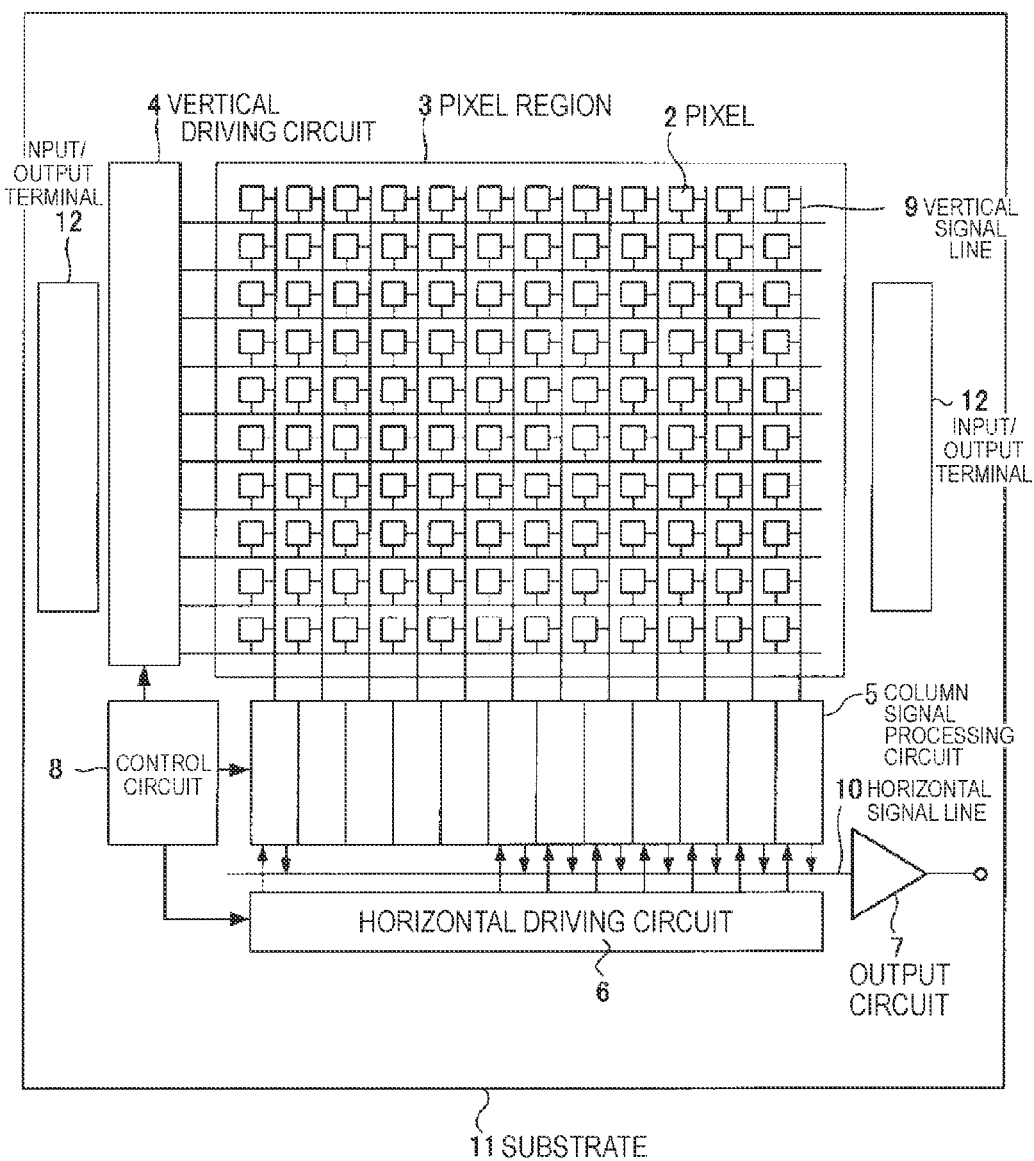
FIG. 1 is a plan view illustrating a configuration of a solid-state image device according to the first embodiment.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, exemplary embodiments for carrying out the present technology will be described. However, the present technology is not limited to the following examples.

Hereinafter, the description will proceed in the following order.
1. First embodiment of solid-state image device
2. Method of fabricating solid-state image device according to first embodiment
3. Second embodiment of solid-state image device
4. Method of fabricating solid-state image device according to second embodiment
5. Third embodiment of solid-state image device
6. Method of fabricating solid-state image device according to third embodiment
7. Electronic apparatus <1. First Embodiment of Solid-State Image Device>
[Diagrammatic Configuration of Solid-State Image Device]

FIG. 1 illustrates a CMOS solid-state image device 1 as an example of a solid-state image device to which an embodiment of the present technology is applied. The configuration in FIG. 1 is a configuration shared by the solid-state image device according to the respective embodiments described hereinafter. Also, in this example, the solid-state image device is described as having a light-incident face on the side of a semiconductor substrate opposite the face where circuits are formed (the front face), also referred to as a back-illuminated CMOS solid-state image device.

As illustrated in FIG. 1, the solid-state image device 1 in this example includes a pixel array 3 (also called the imaging area) in which multiple pixels 2 including a photoelectric transducer are regularly arranged in a two-dimensional array on a semiconductor substrate 11 such as a silicon substrate, as well as peripheral circuits. Unit pixels including a single photoelectric transducer and multiple pixel transistors may be applied as the pixels 2. Alternatively, a pixel-sharing structure, in which a single pixel transistor group (excluding transfer transistors) is shared by multiple photoelectric transducers, may also be applied as the pixels 2. As discussed later, the multiple pixel transistors may have a 3-transistor configuration of a transfer transistor, a reset transistor, and an amplifier transistor, or a 4-transistor configuration with the addition of a select transistor.

The peripheral circuits may include a vertical driving circuit 4, column signal processing circuits 5, a horizontal driving circuit 6, an output circuit 7, and a control circuit 8.

The control circuit 8 receives an input clock and data indicating instructions such as an operational mode, and also outputs data such as internal information on the solid-state image device. In other words, on the basis of a vertical synchronization signal, a horizontal synchronization signal, and a master clock, the control circuit 8 generates control signals and clock signals used as a reference for the operation of circuits such as the vertical driving circuit 4, the column signal processing circuits 5, and the horizontal driving circuit 6. The control circuit 8 then inputs these signals into circuits such as the vertical driving circuit 4, the column signal processing circuits 5, and the horizontal driving circuit 6.

The vertical driving circuit 4 includes a shift resistor, for example, and drives pixels in units of rows by selecting a pixel driving line and supplying pulses for driving the pixels on the selected pixel driving line. In other words, the vertical driving circuit 4 selectively scans pixels 2 in the pixel array 3 in units of rows in a sequential vertical direction. The vertical driving circuit 4 then supplies the column signal processing circuits 5 via vertical signal lines 9 with pixel signals based on the signal charges generated according to the received intensities at the photoelectric transducer (a photodiode, for example) for each pixel 2.

The column signal processing circuits 5 are disposed for each column of pixels 2, for example, and processes signals output from individual rows of pixels 2 so as to remove noise from individual pixel columns, for example. In other words, the column signal processing circuits 5 perform signal processing such as CDS for removing fixed-pattern noise specific to the pixels 2, as well as signal amplification and AD conversion. Horizontal select switches (not illustrated) are provided connected between the output stage of the column signal processing circuits 5 and a horizontal signal line 10.

The horizontal driving circuit 6 includes a shift register, for example, sequentially selects individual column signal processing circuits 5 by sequentially outputting a horizontal scanning pulse, and causes pixel signal from the individual column signal processing circuits 5 to be output to the horizontal signal line 10.

The output circuit 7 processes and outputs signals sequentially supplied via the horizontal signal line 10 from individual column signal processing circuits 5. For example, in some cases the output circuit 7 may simply buffer signals, whereas in other cases the output circuit 7 may perform black level adjustment, column imbalance correction, and various digital signal processing. The input/output terminal 12 exchanges signals with external equipment.

[Diagrammatic Configuration of Pixel Array: Plan View]

Figure 2:
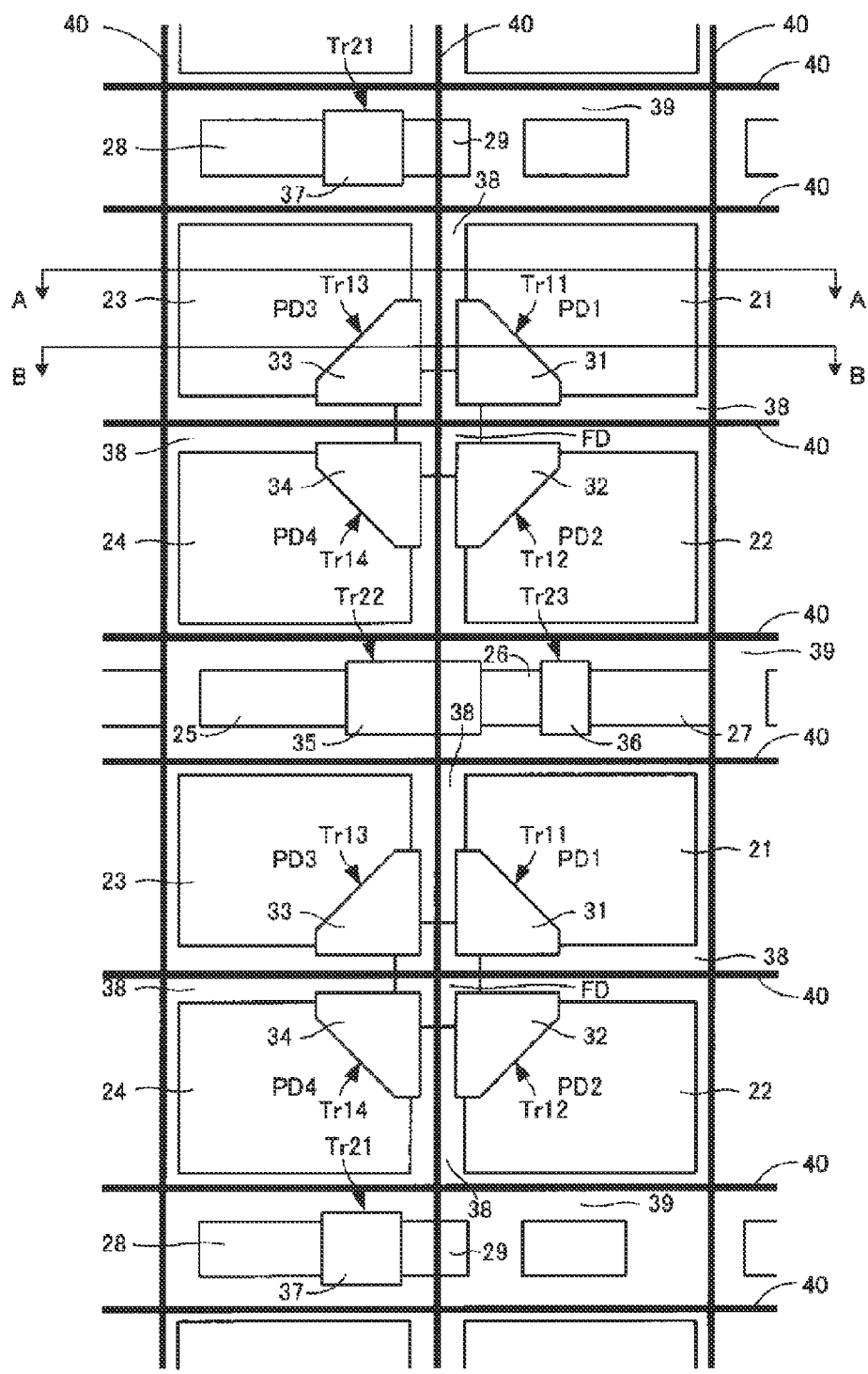
FIG. 2 is a plan view illustrating a configuration of a pixel array in a solid-state image device according to the first embodiment.

Next, a configuration of the pixel array in the solid-state image device in this example will be described. FIG. 2 illustrates a configuration of a pixel array containing 4-pixel shared units applied to the present example. As illustrated in FIG. 2, photodiodes PD for four pixels (PD1 to PD4) are arranged in each 4-pixel sharing unit, which are themselves arranged in a two-dimensional array to form the pixel array.

The 4-pixel sharing unit shares one floating diffusion FD among a total of four photodiodes PD (two horizontal by two vertical). In addition, a 4-pixel sharing unit includes four photodiodes PD1 to PD4, four transfer gate electrodes 31 to 34 for these four photodiodes PD1 to PD4, and one floating diffusion FD.

Transfer transistors Tr11 to Tr14 are formed by the respective photodiodes PD1 to PD4, the floating diffusion FD, and the respective transfer gate electrodes 31 to 34. The floating diffusion FD is disposed centrally, surrounded by the four photodiodes PD1 to PD4, while each of the transfer gate electrodes 31 to 34 is disposed at a position corresponding to the central corner of each of the photodiodes PD1 to PD4.

Also, in FIG. 2, a select transistor Tr23, an amplifier transistor Tr22, and a reset transistor Tr21 are disposed above and below the 4-pixel sharing unit.

The select transistor Tr23 includes paired source/drain areas 26 and 27, and a select gate electrode 36. The amplifier transistor Tr22 includes paired source/drain areas 25 and 26, and an amplifier gate electrode 35. The reset transistor Tr21 includes paired source/drain areas 28 and 29, and a reset gate electrode 37. Each of the above gate electrodes is formed with a polysilicon film, for example. The FD is connected to the amplifier gate electrode 35 of the amplifier transistor Tr22 and the source area 27 of the reset transistor Tr21.

An isolation region 38 is provided between the photodiodes PD1 to PD4 of the 4-pixel sharing unit. Also, an isolation region 39 is provided between the select transistor Tr23, the amplifier transistor Tr22, and the reset transistor Tr21.

A grid pattern 40 is disposed on top of the isolation regions 38 and 39. Also, photoelectric transducer regions 21 to 24 enclosed by the grid pattern 40 are formed in the 4-pixel sharing unit.

The grid pattern 40 is disposed on top of the isolation region 38 between the photodiodes PD1 to PD4 in the 4-pixel sharing unit. The grid pattern 40 is also disposed on top of the isolation region 38 between the photodiodes PD1 to PD4 in the portions where neighboring 4-pixel sharing units adjoin (to the left and right of the 4-pixel sharing unit), similarly to within the 4-pixel sharing unit. In addition, the grid pattern 40 is contiguously formed between adjoining 4-pixel sharing units.

The grid pattern 40 is also disposed between the respective transistors of the 4-pixel sharing unit in the isolation region 39. In addition, the grid pattern 40 is contiguously formed straddling the isolation region 39 above and below in the portions where neighboring 4-pixel sharing units adjoin (above and below the 4-pixel sharing unit).

[Diagrammatic Configuration of Pixel Array: Cross-Section View]

Next, a cross-sectional configuration of the pixel array in the solid-state image device in this example will be described.

Figure 3:
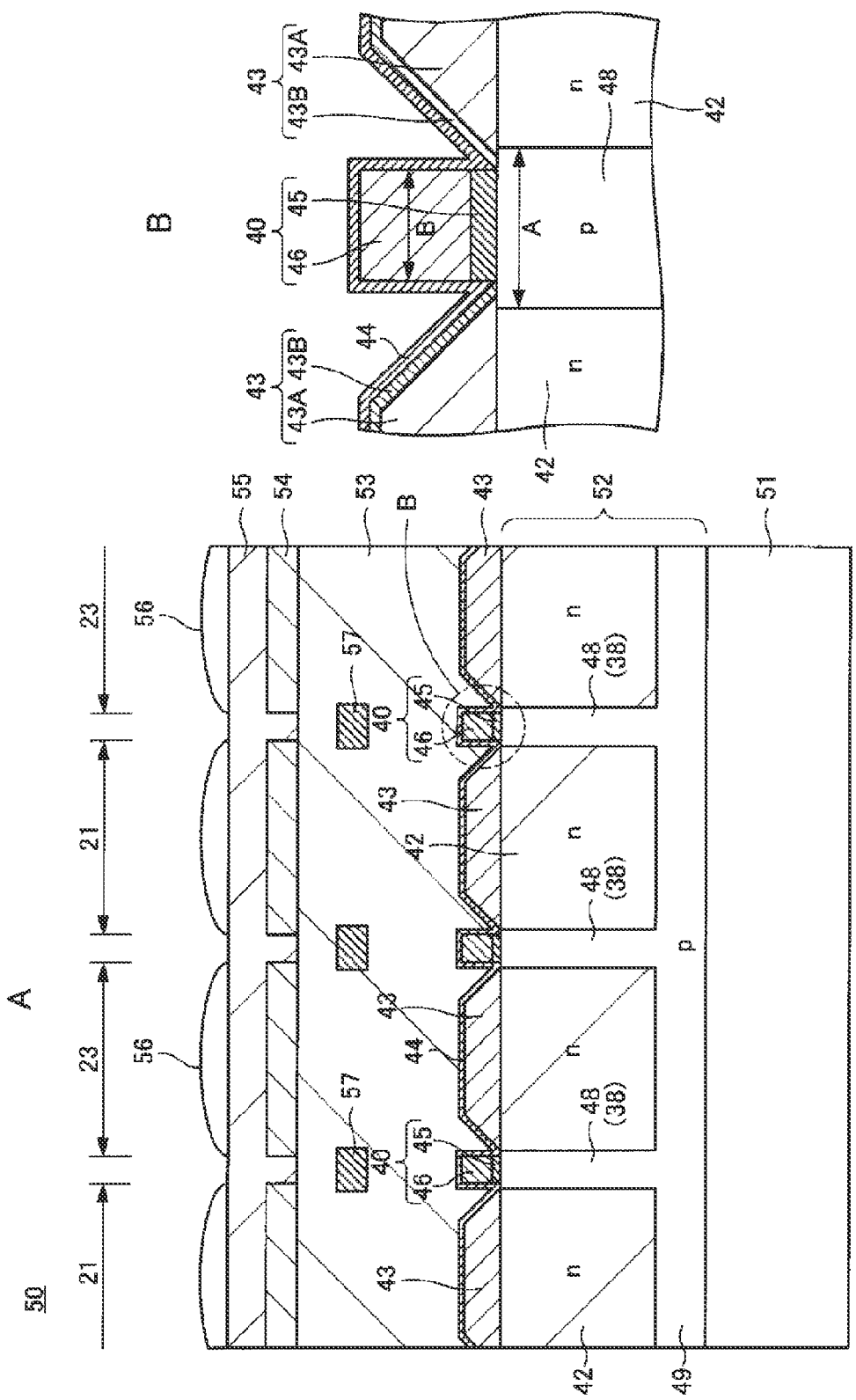

FIG. 3 illustrates a cross-sectional configuration of the pixel array illustrated in FIG. 2, taken along the line A. FIG. 3A is a principal cross-sectional configuration for the pixel array of a solid-state image device, while FIG. 3B is a partial enlarged view of the portion B illustrated in FIG. 3A.

The solid-state image device 50 of this example illustrated in FIG. 3 is what is referred to as a back-illuminated solid-state image device, in which the face on one side of a semiconductor substrate 52 (the bottom of the drawing) is a circuit face where a trace layer 51, pixel transistors, and logic circuits or other peripheral circuits not illustrated are formed, whereas the face on the other side (the top of the drawing) is a light-incident face. In the description hereinafter, the circuit face will be designated the first face or front face of the semiconductor substrate 52, while the light-incident face will be designated the second face or back face of the semiconductor substrate.

As illustrated in FIG. 3A, the semiconductor substrate 52 is provided with a first conductive (p-type) semiconductor region 49 on the surface of the first face. In addition, p-type semiconductor regions 48 contiguously formed from the first face to the surface of the second face are provided at positions corresponding to the isolation region 38 in FIG. 2. Second conductive (n-type) semiconductor regions 42 are also formed in the regions surrounded by the p-type semiconductor regions 48.

The grid pattern 40 and a raised semiconductor layer 43 are also provided on the second face of the semiconductor substrate 52. The grid pattern 40 is formed on top of the p-type semiconductor regions 48 which are included in the isolation region 38. The regions among the grid pattern 40 are the photoelectric transducer regions 21 and 23.

The grid pattern is formed from an insulating layer of given thickness. In FIG. 3, the grid pattern includes a first insulating layer 45 made of $SiO_2$, and a second insulating layer 46 made of SiN. As illustrated in FIG. 2 earlier, the grid pattern is contiguously formed on top of the isolation regions 38 and 39 in the pixel array.

The raised semiconductor layer 43 is formed from a material with a smaller band gap than silicon, such as Ge, $Si_{1-x}Ge_x$ (where 0<x<1), InGaAs, GaAs, InP, or InSb, for example. Using an Si material for the light-absorbing layer may lead to the problem of low sensitivity or insensitivity in the infrared region. The above materials have a larger light absorption coefficient than silicon, particularly in the red-wavelength region. For this reason, a photodiode using these materials are highly sensitive to light in the red to infrared regions.

Besides the above materials, it is also possible to apply compound semiconductors with a chalcopyrite structure to the raised semiconductor layer 43, for example. Potentially applicable compound semiconductors with a chalcopyrite structure include $CuInGaSe_2$, $CuAlS_2$, $CuAlSe_2$, $CuAlTe_2$, $CuGaS_2$, $CuGaSe_2$, $CuGaTe_2$, $CuInS_2$, $CuInSe_2$, $CuInTe_2$, $AgAlS_2$, $AgAlSe_2$, $AgAlTe_2$, $AgGaS_2$, $AgGaSe_2$, $AgGaTe_2$, $AgInS_2$, $AgInSe_2$, and $AgInTe_2$.

The raised semiconductor layer 43 is formed from an epitaxially grown layer of the above materials. Also, the semiconductor layer 43 is a faceted, epitaxially grown layer having a shape whose cross-sectional surface area in a plane parallel to the surface of the semiconductor substrate 52 decreases with increasing distance from the semiconductor substrate 52.

Since the grid pattern 40 is formed on top of the isolation regions on the surface of the semiconductor substrate 52, an epitaxially grown layer is not formed in that portion. In other words, a self-aligned, faceted semiconductor layer 43 is formed among the grid pattern 40 by forming an epitaxially grown layer on top of the semiconductor substrate 52 after the grid pattern 40 has been formed.

The light-absorbing regions that will become photodiodes preferably include only regions of the semiconductor layer 43 with a high light absorption coefficient. Also, in the case of using deeper photodiodes PD, both the semiconductor layer 43 as well as the semiconductor regions inside the semiconductor substrate 52 underneath (the n-type semiconductor regions 42 and the p-type semiconductor region 49) may be included in the photodiodes PD.

Signal charges photoelectrically converted by the semiconductor layer 43 are transferred to the floating diffusion FD by the transfer transistors formed on the first face of the semiconductor substrate 52. At this point, the n-type semiconductor regions 42 become charge transfer paths, and signal charges are transferred from the semiconductor layer 43 to the side of the semiconductor substrate 52 with the first face.

A third insulating layer 44 is also formed covering the grid pattern 40 and the semiconductor layer 43. The third insulating layer 44 is formed from a film having a fixed negative charge. Applicable materials having a fixed negative charge include hafnium oxide, aluminum oxide, zirconium oxide, tantalum oxide, and titanium oxide. Besides the above materials, it is also possible to form a film having a fixed negative charge from lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film, or an aluminum oxynitride film. Silicon (Si) or nitrogen (N) may also be added to a film having a fixed negative charge, insofar as the insulating properties are not impaired. The concentration may be determined appropriately within a range that does not impair the insulating properties of the film. By adding silicon (Si) or nitrogen (N) in this way, it becomes possible to raise the film's heat resistance and ability to inhibit ion implantation during the fabrication process.

As illustrated in FIG. 3B, the grid pattern 40 is formed such that its width B is smaller than the width of the isolation region 38, or in other words the width A of a p-type semiconductor region 48. In addition, the grid pattern 40 is formed such that the surface of the p-type semiconductor region 48 is exposed on either side of the grid pattern 40. For this reason, the edges of the semiconductor layer 43 are formed adjoining the p-type semiconductor regions 48.

The third insulating layer 44 made of a film having a fixed negative charge is formed on the surface of the semiconductor layer 43. For this reason, holes accumulate on the surface of the semiconductor layer 43 adjoining the third insulating layer 44. In other words, the surface of the semiconductor layer 43 becomes p-type, and thus the semiconductor layer 43 takes on a structure having a semiconductor layer 43A and a p-type semiconductor layer 43B formed on its surface.

By making the surface of the semiconductor layer 43 p-type in this way, the p-type semiconductor regions 48 of the semiconductor substrate 52 and the p-type semiconductor layer 43B form a continuous p-type region. In addition, the semiconductor layer 43A and the p-type semiconductor layer 43B are included in a photodiode PD with a hole-accumulated diode (HAD) structure. Also, by establishing conductive continuity between the p-type semiconductor layer 43B and the p-type semiconductor regions 48, it is possible to suppress dark current produced at the surface of the semiconductor layer 43.

Also, as illustrated in FIG. 3A, a trace layer 51 is provided on the first face of the semiconductor substrate 52. The trace layer 51 is a laminated structure of components such as various elements and various circuits formed on the first face of the semiconductor substrate 52, with multiple traces and inter-layer insulating layers covering these components. The semiconductor substrate 52 is affixed to a support substrate (not illustrated) at the surface of the trace layer 51.

An inter-layer film 53 covering the third insulating layer 44 is formed on the second face of the semiconductor substrate 52. The inter-layer film 53 is formed from an anti-reflective film, a protective film, or a planarizing film, for example.

A light shielding film 57 is formed in the inter-layer film 53. The light shielding film 57 is formed over the isolation regions of the pixel array. In FIG. 3A, the light shielding film 57 is formed above the p-type semiconductor regions 48 which will become the isolation regions.

Color filters 54 corresponding to respective pixels are disposed on top of the inter-layer film 53. A planarizing film 55 is formed on top of the color filters 54, and on-chip lenses 56 corresponding to respective pixels are formed on top of the planarizing film 55.

With the above configuration, it is possible to improve the light-condensing properties and the pixel sensitivity (mainly in long-wavelength regions) in a back-illuminated solid-state image device. Specifically, by forming a grid pattern on the surface of the back side under the PD regions, a faceted SiGe layer is formed by selective epitaxial growth. Since the semiconductor layer that will become the photoelectric transducers is faceted, the condensing of light onto the PDs is improved, making it possible to improve pixel sensitivity and suppress color bleeding.

Also, by forming a semiconductor layer made of a material with a smaller band gap than silicon on top of the semiconductor substrate, it becomes possible to absorb long-wavelength light (including light in the infrared region) at comparatively shallow regions, thus making it possible to form shallower PDs compared to ordinary back-illuminated image sensors. In other words, the above contributes to pixel miniaturization.

Note that a film having a fixed negative charge may be omitted in the case of applying a p-type compound semiconductor with a chalcopyrite structure as the semiconductor layer 43. In this case, the semiconductor layer 43 made of the p-type compound semiconductor and the n-type semiconductor regions 42 of the semiconductor substrate 52 are included in the photodiodes PD. Additionally, signal charges (electrons) produced at the semiconductor layer 43 are transferred to the n-type semiconductor regions 42 of the semiconductor substrate 52, and are transferred to the floating diffusion FD by the gate electrodes on the first face of the semiconductor substrate 52.

<2. Method of Fabricating Solid-State Image Device According to First Embodiment>

Figure 12:
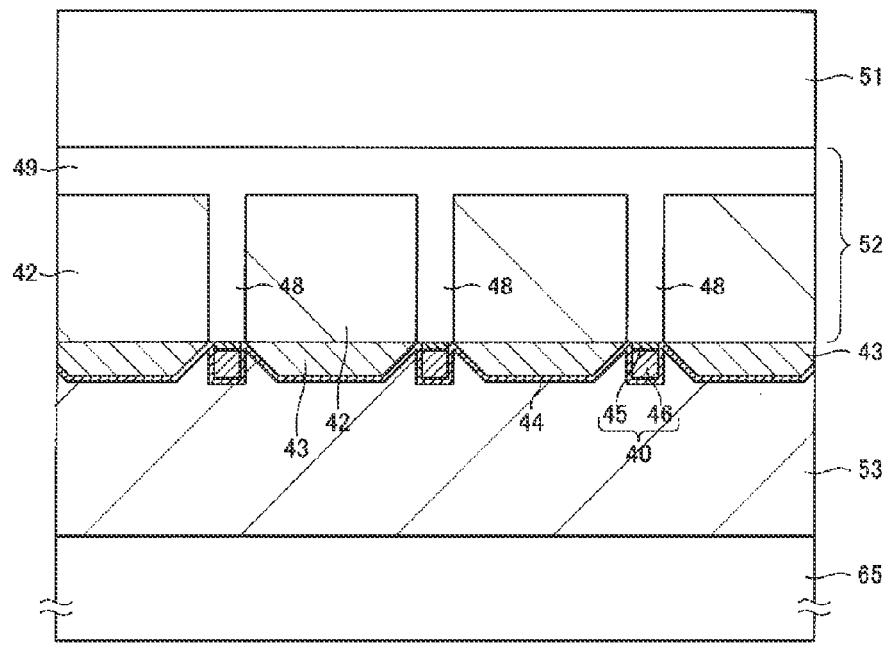
FIG. 12 is a fabrication process diagram for a solid-state image device according to the first embodiment.
Figure 13:
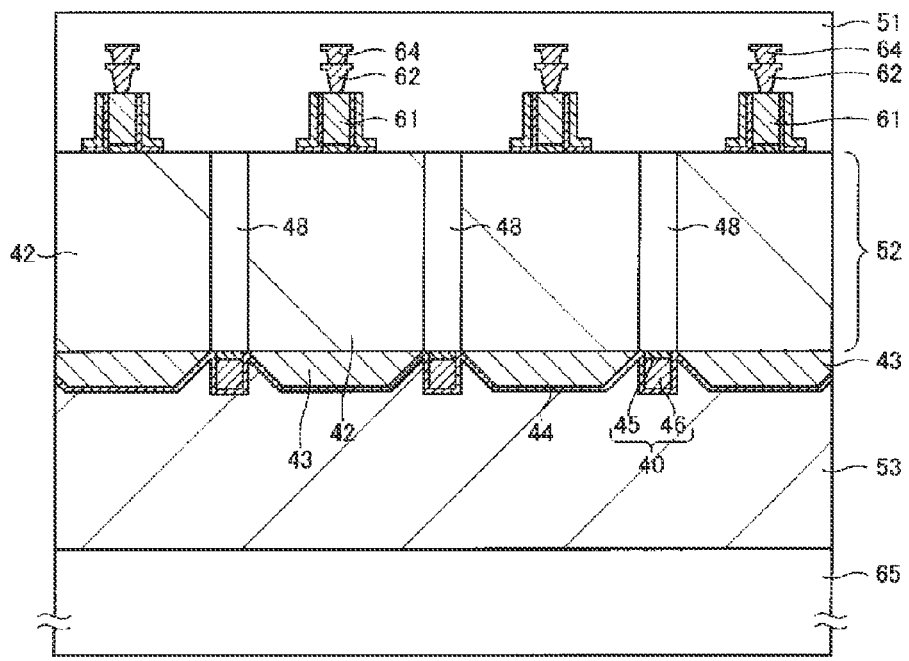
FIG. 13 is a fabrication process diagram for a solid-state image device according to the first embodiment.

Next, a method of fabricating a solid-state image device according to the first embodiment discussed above will be described. FIGS. 4 to 14 are fabrication process diagrams for a solid-state image device according to the first embodiment, and more particularly, are diagrams illustrating fabrication processes for regions where photoelectric transducers are formed. Note that FIG. 4, FIGS. 6 to 12, and FIG. 14 are diagrams illustrating a cross-sectional configuration taken along the line A in FIG. 2. Also, FIGS. 5 and 13 are diagrams illustrating a cross-sectional configuration taken along the line B in FIG. 2.

Figure 4:
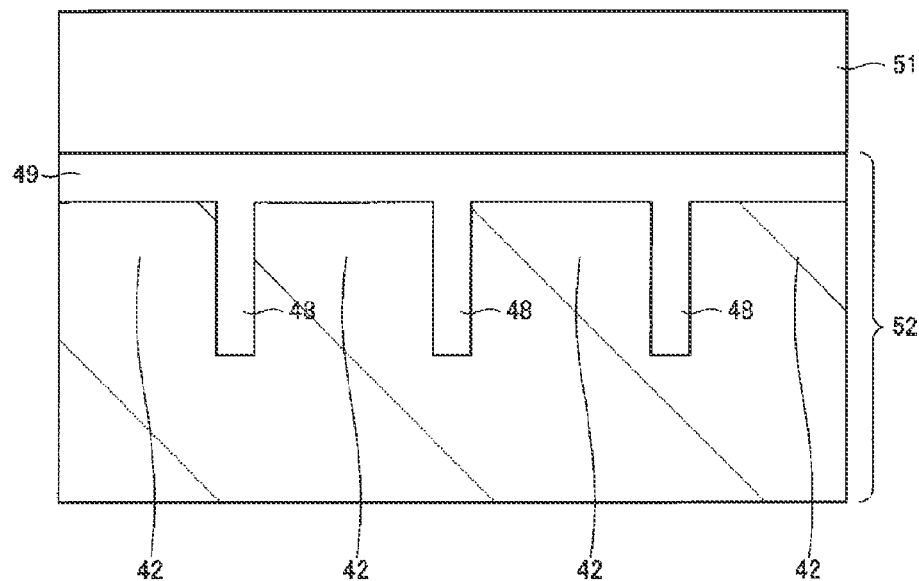
FIG. 4 is a fabrication process diagram for a solid-state image device according to the first embodiment.
Figure 5:
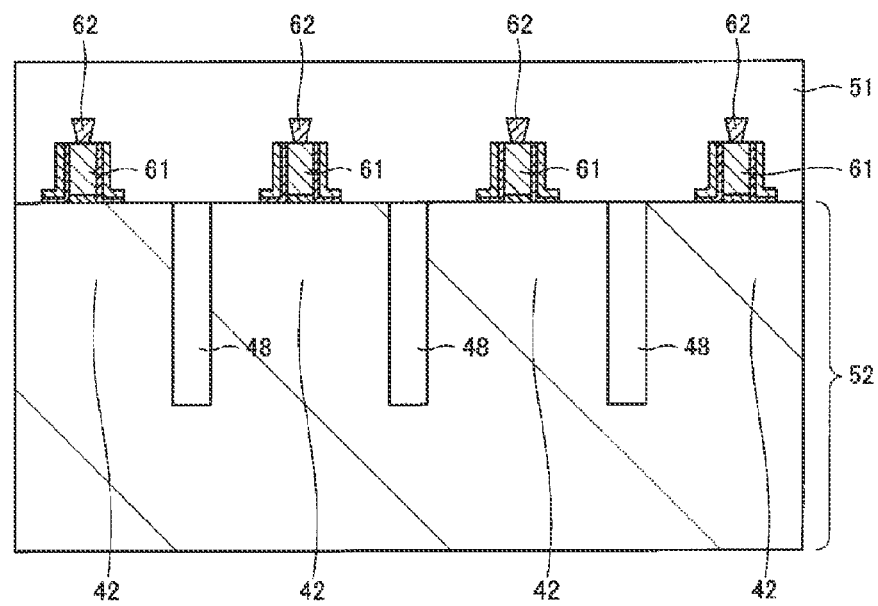
FIG. 5 is a fabrication process diagram for a solid-state image device according to the first embodiment.

First, as illustrated in FIGS. 4 and 5, the respective structures of the semiconductor substrate 52 and the trace layer 51 are formed by applying an established method of fabricating a solid-state image device according to the related art.

As illustrated in FIG. 4, the p-type semiconductor region 49 is formed on the surface of the first face of the semiconductor substrate 52. As illustrated in FIG. 5, the p-type semiconductor region 49 is not formed underneath gate electrodes. Furthermore, as illustrated in FIGS. 4 and 5, p-type semiconductor regions 48 are formed down to a given depth from the first face of the semiconductor substrate 52 in the isolation regions. The depth to which the p-type semiconductor regions 48 are formed is taken to be equal to or greater than the thickness of the ultimately thinned semiconductor substrate 52.

In addition, n-type semiconductor regions 42 are formed. The n-type semiconductor regions 42 are formed between the p-type semiconductor regions 48 that will become the isolation regions in the pixel array.

Also, as illustrated in FIG. 5, gate electrodes 61 are formed on the first face of the semiconductor substrate 52 via a gate insulating layer. In addition, various circuits (not illustrated) are formed on the first face of the semiconductor substrate 52.

Contacts 62 that connect the gate electrodes 61 to the trace layer 51 and multiple layers of traces (not illustrated) are also formed.

Figure 6:
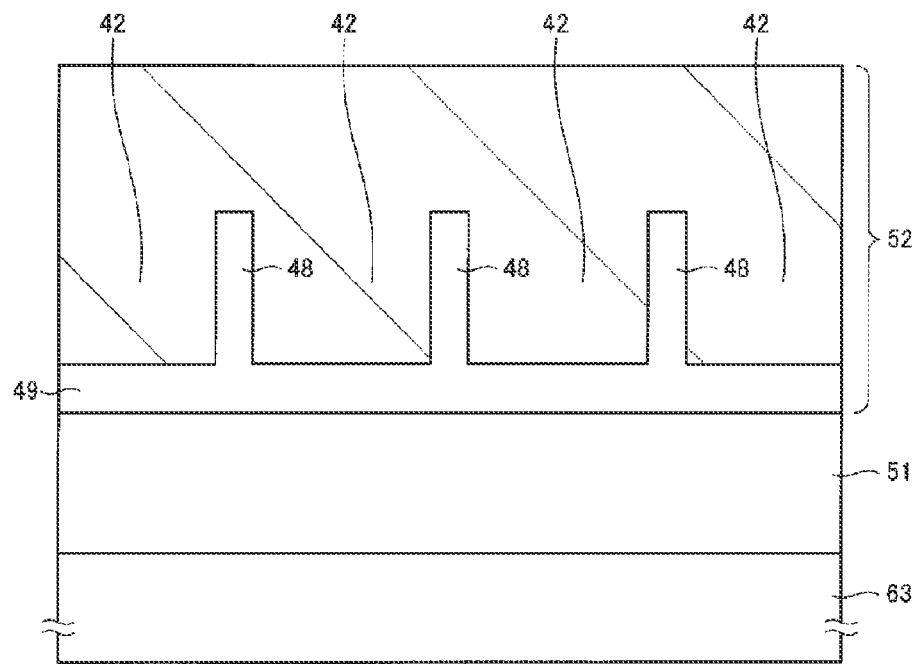
FIG. 6 is a fabrication process diagram for a solid-state image device according to the first embodiment.
Figure 7:
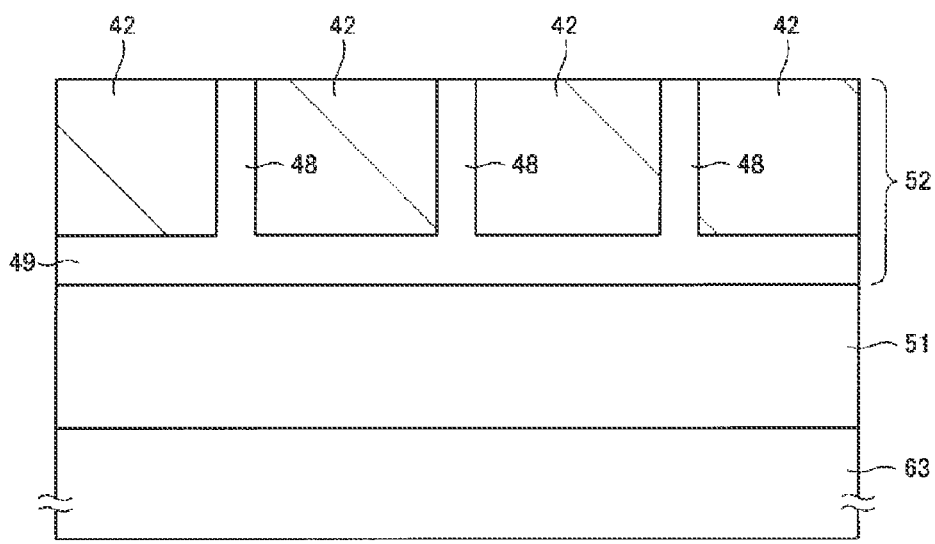
FIG. 7 is a fabrication process diagram for a solid-state image device according to the first embodiment.
Figure 8:
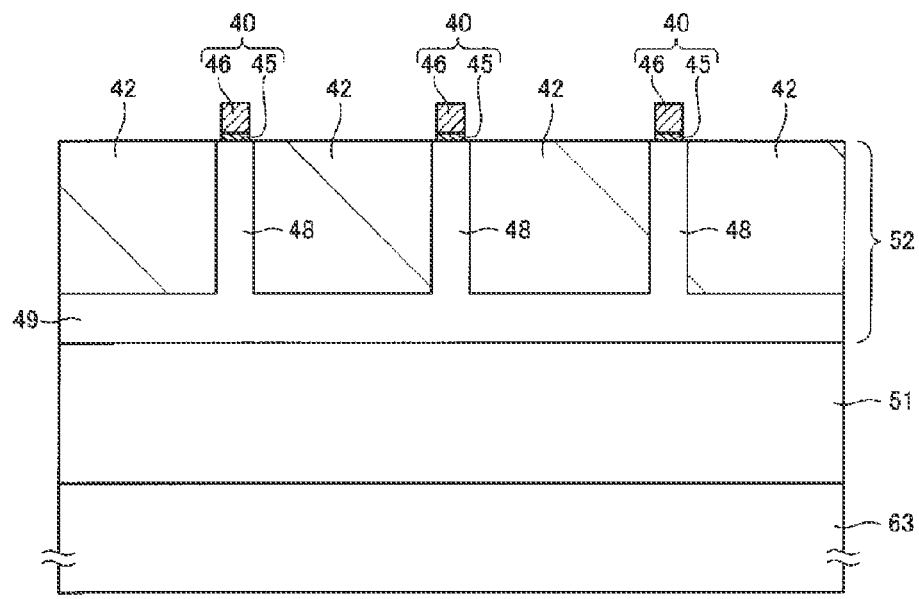
FIG. 8 is a fabrication process diagram for a solid-state image device according to the first embodiment.

Next, a support substrate 63 is affixed on top of the trace layer 51, and the semiconductor substrate 52 is turned over, as illustrated in FIG. 6. Then, as illustrated in FIG. 7, the semiconductor substrate 52 is thinned by polishing the second face of the semiconductor substrate 52 until the p-type semiconductor regions 48 and the n-type semiconductor regions 42 are exposed.

Next, the first insulating layer 45 and the second insulating layer 46 are formed on top of the p-type semiconductor regions 48. For example, 5 nm of $SiO_2$ may be formed on top of the second face of the semiconductor substrate 52 as the first insulating layer 45. Then, 10 nm of SiN may be formed on top of the $SiO_2$ as the second insulating layer 46. The $SiO_2$ and SiN on top of the p-type semiconductor regions 48 is then retained by photolithography resist patterning and etching. Thus, the grid pattern 40 is formed over the isolation regions of the pixel array. The grid pattern 40 is formed having a narrower width than the p-type semiconductor regions 48 that will become the isolation regions.

Figure 9:
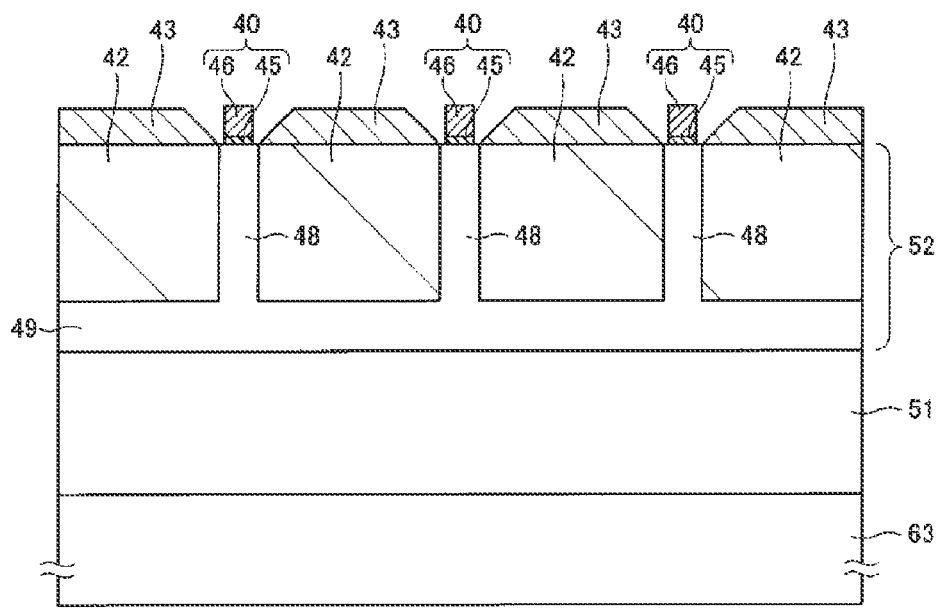
FIG. 9 is a fabrication process diagram for a solid-state image device according to the first embodiment.

Next, as illustrated in FIG. 9, a raised semiconductor layer 43 having a faceted surface is formed on top of the n-type semiconductor regions 42. The raised semiconductor layer 43 is formed by established faceted epitaxial growth using a material with a smaller band gap than silicon as discussed earlier.

With the above epitaxial growth, it is possible to form facets at arbitrary angles and multiple plane directions, depending on conditions.

For example, it is possible to form an epitaxial layer made of $Si_{1-x}Ge_x$ (where 0<x<1) at a growth temperature of 750° C., a pressure of 10 Torr, the gases $SiH_2Cl_2$ (100 sccm), HCL (25 sccm), $GeH_4$ (50 sccm to 100 sccm), and a boron concentration of 140 sccm using $B_2H_6$. Epitaxial growth may be conducted for 30 to 60 minutes at approximately 500° C., for example.

Also, in the case of forming the semiconductor layer 43 from a compound semiconductor with a chalcopyrite structure as discussed earlier, methods such as molecular beam epitaxy (MBE), metalorganic chemical vapor deposition (MOCVD), and liquid phase epitaxy (LPE) may be used. The formation temperature for the semiconductor layer 43 may be from 200° C. to 500° C., for example.

Figure 10:
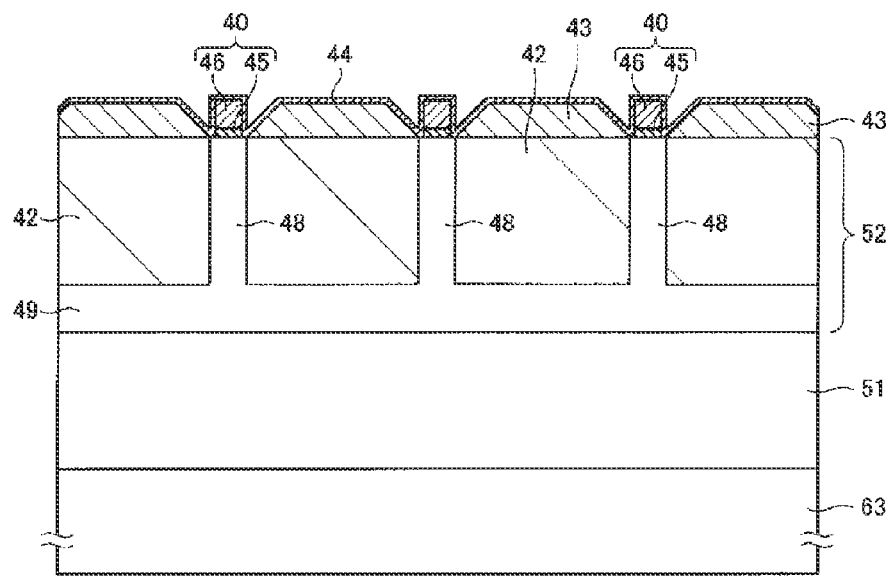
FIG. 10 is a fabrication process diagram for a solid-state image device according to the first embodiment.

Next, as illustrated in FIG. 10, a third insulating layer 44 is formed covering the grid pattern 40 and the semiconductor layer 43. The third insulating layer 44 is formed with a film having a fixed negative charge. By forming a third insulating layer 44 on top of the semiconductor layer 43 with a film having a fixed negative charge, a p-type semiconductor layer is formed on the surface of the semiconductor layer 43, thereby forming an HAD structure.

Figure 11:
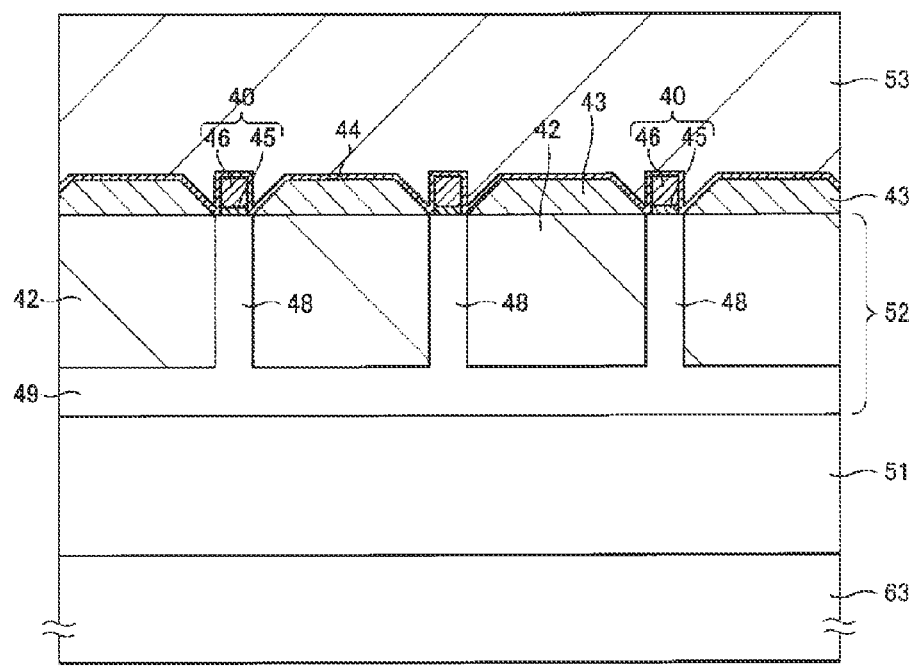
FIG. 11 is a fabrication process diagram for a solid-state image device according to the first embodiment.

Next, as illustrated in FIG. 11, an inter-layer film 53 is formed on the second face of the semiconductor substrate 52. A support substrate 65 is then affixed on top of the inter-layer film 53, and the semiconductor substrate 52 is turned over, as illustrated in FIG. 12. Additionally, the support substrate 63 that was affixed to the trace layer 51 is removed, exposing the trace layer 51.

Then, as illustrated in FIG. 13, the trace layer 51 is formed by stacking traces, such as the traces 64 that connect to the contacts 62, and inter-layer insulating layers.

Figure 14:
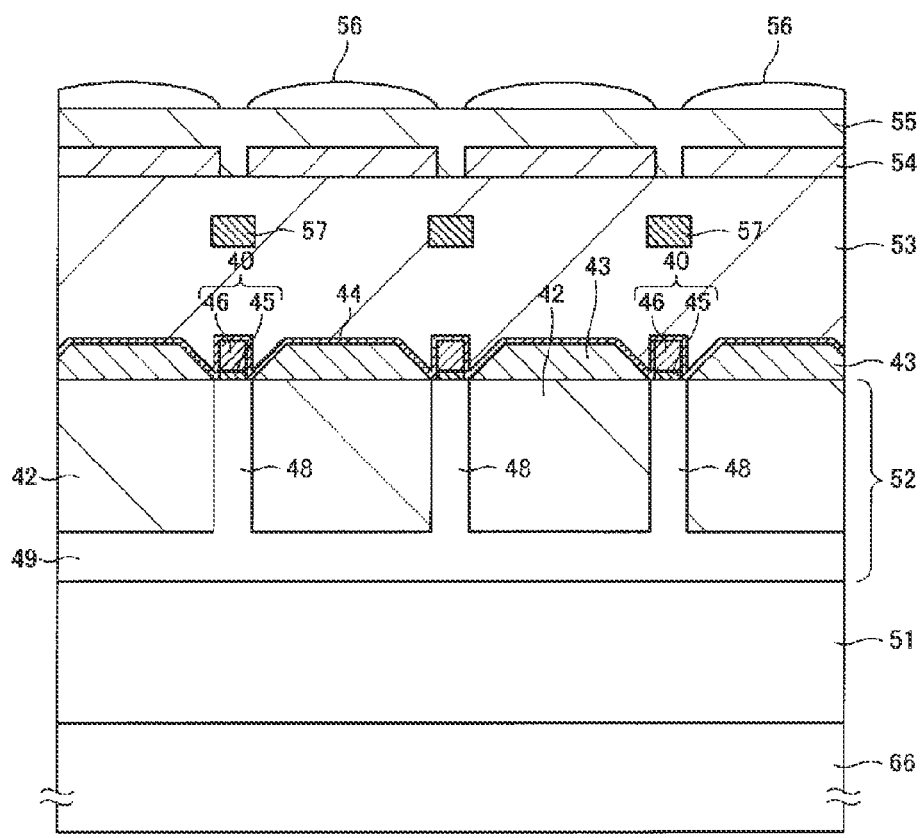
FIG. 14 is a fabrication process diagram for a solid-state image device according to the first embodiment.

Next, a support substrate 66 is affixed on top of the trace layer 51, and the semiconductor substrate 52 is turned over, as illustrated in FIG. 14. The support substrate 65 is then removed, exposing the inter-layer film 53. A light shielding film 57 is then formed in the inter-layer film 53. Additionally, color filters 54 corresponding to respective pixels are formed on top of the inter-layer film 53. A planarizing film 55 is formed on top of the color filters 54, and on-chip lenses 56 corresponding to respective pixels are formed on top of the planarizing film 55.

With the above processes, it is possible to fabricate the solid-state image device in this example.

With the above fabrication method, a grid pattern that inhibits epitaxial growth is first formed over isolation regions, and then an epitaxially grown layer having a faceted surface is formed on top of the semiconductor substrate 52. For this reason, it is possible to form a self-aligning semiconductor layer 43 with an epitaxially grown layer within the regions surrounded by the isolation regions. Also, by forming the grid pattern with a smaller width than the isolation regions, the p-type semiconductor layer formed on the surface of the epitaxially grown layer with a film having a fixed negative charge becomes connected to the p-type semiconductor regions in the isolation regions. Thus, it is possible to form photodiodes PD with an HAD structure.

[Configuration of Peripheral Circuits]

Figure 15:
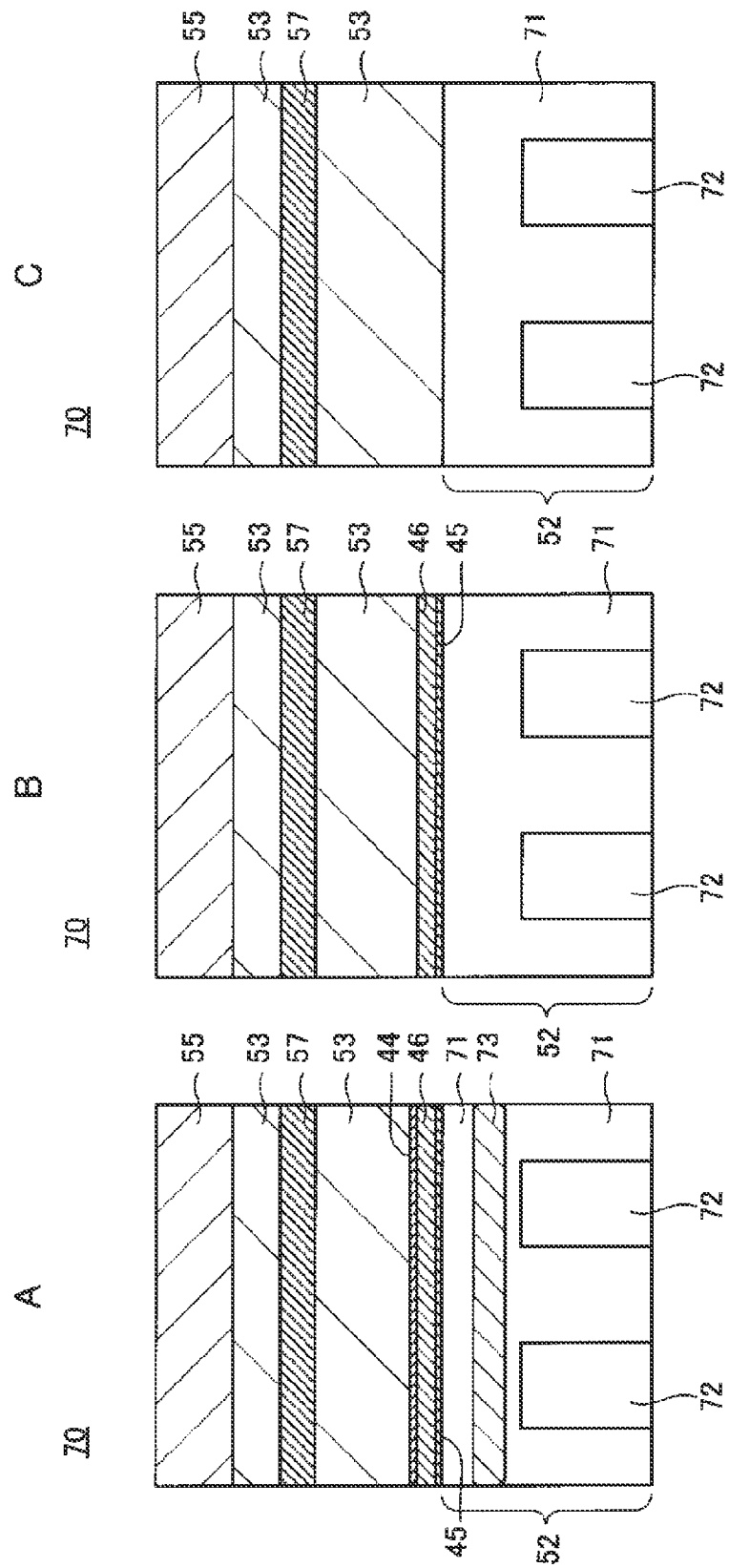

FIG. 15 illustrates cross-sectional configurations of peripheral circuits formed in the vicinity of a pixel array.

FIG. 15A is a configuration applying the first insulating layer 45, the second insulating layer 46, and the third insulating layer 44 of the present technology to peripheral circuits in a typical solid-state image device. FIGS. 15B and 15C are configurations of peripheral circuits applicable to a solid-state image device according to the present embodiment discussed above.

As illustrated in FIG. 15A, the first insulating layer 45 and the second insulating layer 46 are formed on the second face of the semiconductor substrate 52. Here, a grid pattern is not formed by the first insulating layer 45 and the second insulating layer 46, with the first insulating layer 45 and the second insulating layer 46 being formed over the entire surface of the peripheral circuits. In addition, the third insulating layer 44 is formed on top of the second insulating layer 46. The inter-layer film 53 and the planarizing film 55 are additionally formed on top of the third insulating layer 44. A light shielding film 57 is formed in the inter-layer film 53 so as to cover the entire surface of the peripheral circuits. Note that in FIGS. 15A to 15C, the trace layer formed on the first face of the semiconductor substrate 52 has been omitted from illustration.

The semiconductor substrate 52 for the peripheral circuits realized by n-type semiconductor regions 71. In addition, p-type semiconductor regions 72 that will become the source/drain of transistors not illustrated are formed at the surface of the first face of the semiconductor substrate 52.

In the case of forming a film having a fixed negative charge (the third insulating layer 44) on the second face as illustrated in FIG. 15A, the holes that accumulate on the surface of the second face of the semiconductor substrate 52 due to this film affect the p-type semiconductor regions 72.

If a film having a fixed negative charge (the third insulating layer 44) is formed directly on top of the semiconductor substrate 52, the semiconductor substrate 52 will be damaged during the process of removing this film. For this reason, an n-type semiconductor region 73 with scattered n-type impurities is formed between the p-type semiconductor regions 72 and the second face, without removing the film having a fixed negative charge. The n-type semiconductor region 73 suppresses the effects exerted on the p-type semiconductor regions 72 by holes accumulated on the surface of the second face of the semiconductor substrate 52.

In contrast, in the present embodiment, a first insulating layer 45 made of $SiO_2$ and a second insulating layer 46 made of SiN are formed on top of the semiconductor substrate 52. With this configuration, the semiconductor substrate 52 is protected from damage by the first insulating layer 45 and the second insulating layer 46, even in the case of removing the third insulating layer 44 made of a film having a fixed negative charge.

For this reason, it is possible to remove the third insulating layer 44, as illustrated in FIG. 15B. By removing the third insulating layer 44, it is possible to omit forming an n-type semiconductor region 73 on the semiconductor substrate 52. Removal of the third insulating layer 44 may be accomplished by photolithography resist patterning and wet etching using hydrofluoric acid, for example. Thus, in the fabrication process, it is possible to omit the process of forming an n-type semiconductor region 73 on the semiconductor substrate 52.

Also, as illustrated in FIG. 15C, it is possible to obtain a configuration in which not only the third insulating layer 44 but also the first insulating layer 45 and the second insulating layer 46 are removed. In the case where the first insulating layer 45 and the second insulating layer 46 are made of $SiO_2$ and SiN, removal is possible without damaging the semiconductor substrate 52, unlike a material having a fixed negative charge as discussed above. For this reason, by removing the first insulating layer 45, the second insulating layer 46, and the third insulating layer 44, it is possible to omit the process of forming an n-type semiconductor region 73 on the semiconductor substrate 52.

[Modification]

Next, a modification of the first embodiment discussed above will be described.

Figure 16:
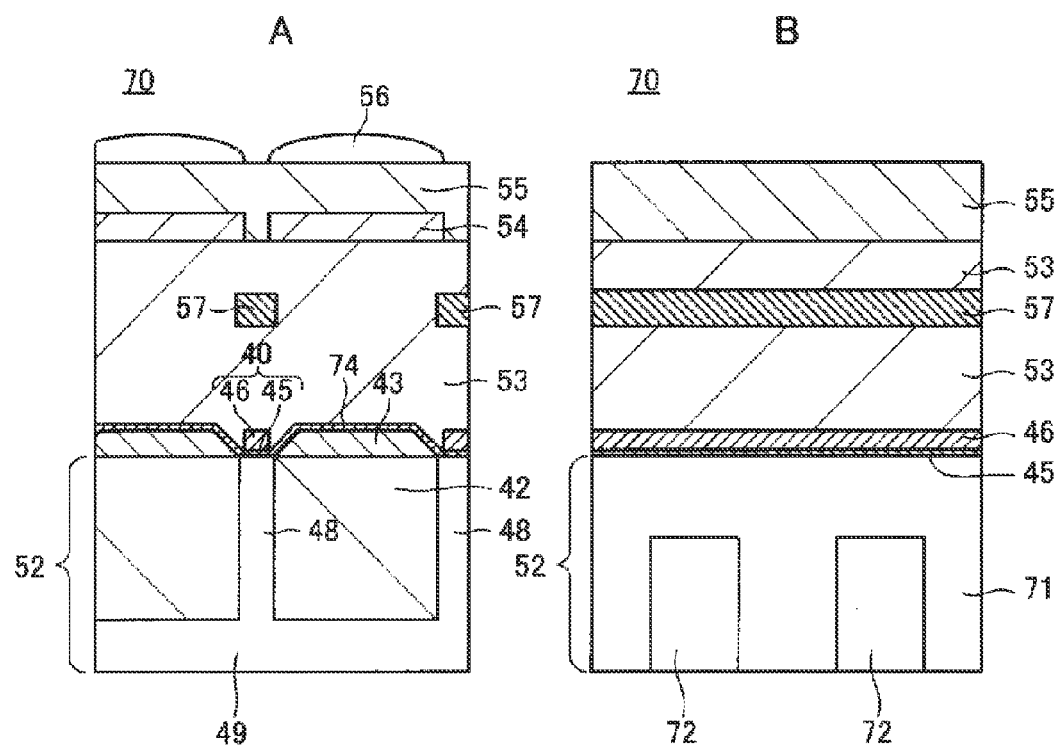

FIG. 16 illustrates configurations of a solid-state image device according to a modification of the first embodiment. FIG. 16A is a diagram illustrating a cross-sectional configuration of a pixel array taken along the line A in FIG. 2. FIG. 16B is a diagram illustrating a cross-sectional configuration of peripheral circuits.

In the first embodiment discussed above, the surface of a raised semiconductor layer made of an epitaxially grown layer becomes p-type as a result of forming a third insulating layer made of a film having a fixed negative charge. In the modification described below, the method of forming a p-type semiconductor layer on the surface of an epitaxially grown layer differs from the first embodiment discussed above. For this reason, in the following description, only the parts of the configuration that differ from the first embodiment discussed above will be described, while parts of the configuration that are similar to the first embodiment will be omitted from the description.

As illustrated in FIG. 16A, a p-type semiconductor layer 74 is formed on the surface of the raised semiconductor layer 43. The semiconductor layer 43 is made of an epitaxially grown layer, similarly to the first embodiment discussed earlier. The p-type semiconductor layer 74 is formed by in-situ doped epitaxial growth. In this way, the semiconductor layer 43 and the p-type semiconductor layer 74 are included in a photodiode PD with a hole-accumulated diode (HAD) structure.

The above configuration may be fabricated as part of the fabrication method of the first embodiment by conducting the process of forming the raised semiconductor layer 43 according to the following method.

After forming the grid pattern 40, the semiconductor layer 43 is formed on top of the semiconductor substrate 52 by faceted epitaxial growth according to a similar method as in the first embodiment. Then, the last part of the process of forming the semiconductor layer 43 involves forming a p-type semiconductor layer 74 on the surface of the semiconductor layer 43 by in-situ doped epitaxial growth. The p-type semiconductor layer 74 may have an impurity concentration of $1.0 \times 10^{17}$ ($1/cm^3$), and a thickness of 5 nm.

The p-type semiconductor layer 74 formed by in-situ doped epitaxial growth has extremely low impurity scattering compared to a p-type semiconductor layer formed by impurity scattering such as ion implantation. For this reason, it is possible to improve the saturation signal charge (Qs) of the photodiodes PD compared to ordinary methods based on ion implantation.

As discussed above, by forming a p-type semiconductor layer 74 on the surface of the semiconductor layer 43 it is possible to omit forming a film having a fixed negative charge in order to make the surface of the semiconductor layer 43 become p-type in the first embodiment. For this reason, a film having a fixed negative charge is not formed on top of the second insulating layer 46.

Also, as illustrated in FIG. 16B, the semiconductor layer 43 and the p-type semiconductor layer 74 are not formed at the peripheral circuits where the first insulating layer 45 and the second insulating layer 46 are formed, similarly to the grid pattern 40. For this reason, it is possible to omit forming an n-type semiconductor region 73 (FIG. 15A) on the semiconductor substrate 52, similarly to FIG. 15B discussed earlier. Thus, in the fabrication process, it is possible to omit the process of forming the n-type semiconductor region 73 on the semiconductor substrate 52.

<3. Second Embodiment of Solid-State Image Device>

Next, a second embodiment of a solid-state image device will be described. In the second embodiment, the grid pattern and its peripheral configuration differs from that of a solid-state image device according to the first embodiment discussed above. For this reason, in the following description of the second embodiment, only the grid pattern and its peripheral configuration which differ from the foregoing first embodiment will be described, while parts of the configuration that are similar to the first embodiment will be omitted from description.

Figure 17:
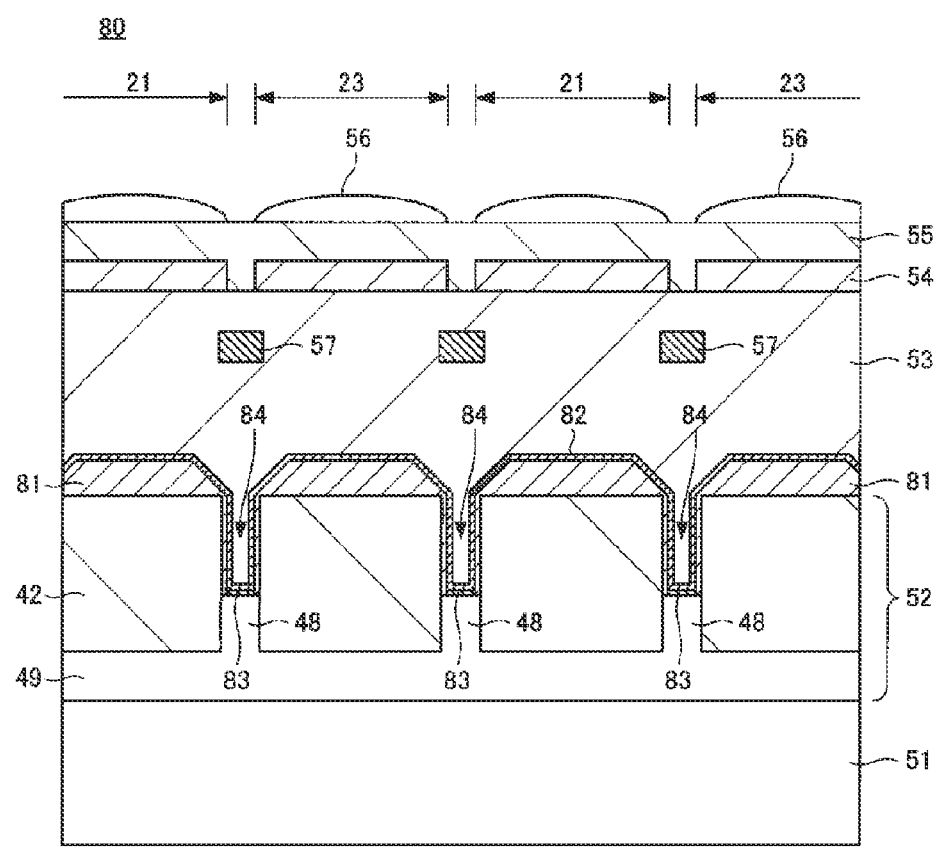
FIG. 17 is a cross-section view illustrating a configuration of a solid-state image device according to the second embodiment.

FIG. 17 illustrates a configuration of a solid-state image device according to the second embodiment. FIG. 17 is a diagram illustrating a cross-sectional configuration taken along the line A in FIG. 2.

As illustrated in FIG. 17, in a solid-state image device according to the second embodiment, a grid pattern is realized by trenches 84 formed on the second face of the semiconductor substrate 52. With the trenches 84, the grid pattern 40 surrounding the pixels as illustrated in the earlier FIG. 2 is formed.

The trenches 84 are formed in the p-type semiconductor regions 48 which will become the isolation regions in the semiconductor substrate 52. The trenches 84 are formed to a depth equal to or greater than the thickness of the epitaxially grown semiconductor layer 81. Thus, when forming the semiconductor layer 81, it is possible to block connections among the sections of epitaxially grown layer on the second face of the semiconductor substrate 52, without the trenches 84 becoming buried under the epitaxially grown layer. Also, the trenches 84 are formed to a depth that is shallow enough to not affect the configuration of the various transistors and other elements formed on the first face of the semiconductor substrate 52.

The semiconductor layer 81 is contiguously formed into the trenches 84 (on the walls and floor) starting from the second face of the semiconductor substrate 52. The semiconductor layer 81 may be realized by a material similar to that of the semiconductor layer 43 (FIG. 3) included in the photodiodes PD in the first embodiment discussed earlier. Since the semiconductor layers are formed contiguously along the walls of the trenches 84, photoelectric transduction becomes possible on the walls of the trenches 84. Also, since the speed of epitaxial growth slows inside the trenches 84, the thickness of the semiconductor layer 81 inside the trenches 84 is less than that on top of the semiconductor substrate 52.

An insulating layer 82 is formed on top of the semiconductor layer 81. The insulating layer 82 is formed from a film having a fixed negative charge. The insulating layer 82 is formed contiguously from the surface of the semiconductor layer 81 formed on the second face of the semiconductor substrate 52 to the surface of the semiconductor layer 81 inside the trenches 84.

In addition, holes accumulate in the semiconductor layer 81 due to the insulating layer 82 made of a film having a fixed negative charge, forming a p-type semiconductor layer on the surface of the semiconductor layer 81. Thus, photodiodes PD with an HAD structure are formed.

Also, p-type diffusion regions 83 containing ion-implanted p-type impurities are formed in the semiconductor layer 81 on the floor of the trenches 84. Because of the p-type diffusion regions 83, connections are severed between adjoining sections of the semiconductor layer 81. Also, the p-type semiconductor regions 48 and the p-type semiconductor layer formed on the surface of the semiconductor layer 81 are connected via the p-type diffusion regions 83.

Note that the relative widths of the trenches 84 and the p-type semiconductor regions 48 are unimportant. The trenches 84 may be wider than the p-type semiconductor regions 48, and the trenches 84 may be formed extending into the n-type semiconductor regions 42. However, trenches 84 with narrower widths are preferable because this increases the surface area of the semiconductor layer 81 made of an epitaxially grown layer on top of the semiconductor substrate 52, thus increasing the proportion of the surface area occupied by photoelectric transducers.

Additionally, a film having a fixed negative charge may be omitted in the case of applying a p-type compound semiconductor with a chalcopyrite structure as the semiconductor layer 81. Furthermore, the p-type diffusion regions 83 may also not be formed on the floor of the trenches 84. In this case, the semiconductor layer 81 made of the p-type compound semiconductor and the n-type semiconductor regions 42 is included in the photodiodes PD. Additionally, signal charges (electrons) produced at the semiconductor layer 43 are transferred to the n-type semiconductor regions 42 of the semiconductor substrate 52, and are transferred to the floating diffusion FD by the gate electrodes on the first face of the semiconductor substrate 52.

By forming trenches in the semiconductor substrate 52 as in the second embodiment discussed above, it is possible to form a grid pattern by a method other than forming an insulating layer on top of the semiconductor substrate 52 as in the first embodiment. The grid pattern is configured to be able to inhibit epitaxial growth of the semiconductor layers that will become the photodiodes PD by surrounding the photoelectric transducer regions, making faceted epitaxial growth possible. For example, if an insulating layer (SiN) is provided, epitaxial growth does not occur, making faceted epitaxial growth possible. Likewise, if trenches are provided, epitaxial growth inside the trenches is sufficiently slower than on top of the semiconductor substrate to make faceted epitaxial growth possible. In this way, the grid pattern that surrounds the photoelectric transducer regions is not particularly limited, and configurations other than an insulating layer or trenches may also be applied insofar as the configuration enables selective epitaxial growth.

<4. Method of Fabricating Solid-State Image Device According to Second Embodiment>

Next, a method of fabricating a solid-state image device according to the second embodiment discussed above will be described. FIGS. 18 to 22 are fabrication process diagrams for a solid-state image device according to the second embodiment, and more particularly, are diagrams illustrating fabrication processes for regions where photoelectric transducers are formed. Note that FIGS. 18 to 22 are diagrams illustrating a cross-sectional configuration taken along the line A in FIG. 2.

Figure 18:
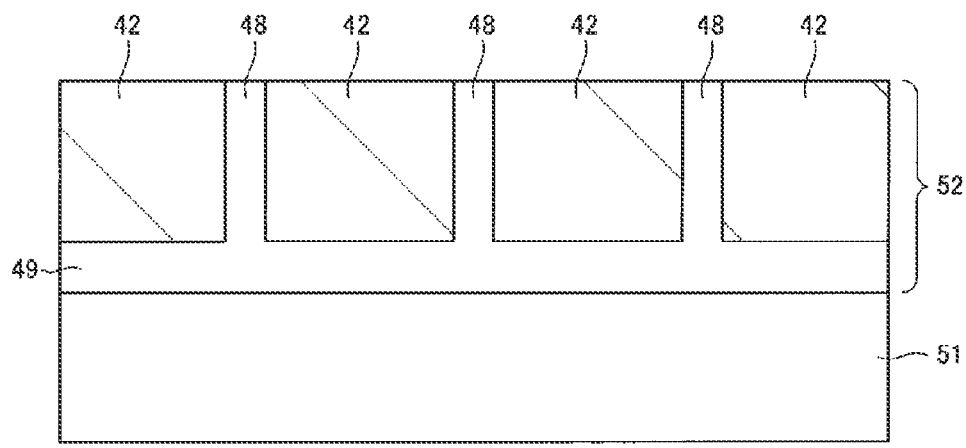
FIG. 18 is a fabrication process diagram for a solid-state image device according to the second embodiment.

First, the semiconductor substrate 52 is thinned by polishing the second face of the semiconductor substrate 52 until the p-type semiconductor regions 48 and the n-type semiconductor regions 42 are exposed, according to a method similar to that of the first embodiment discussed earlier. FIG. 18 illustrates this state.

Figure 19:
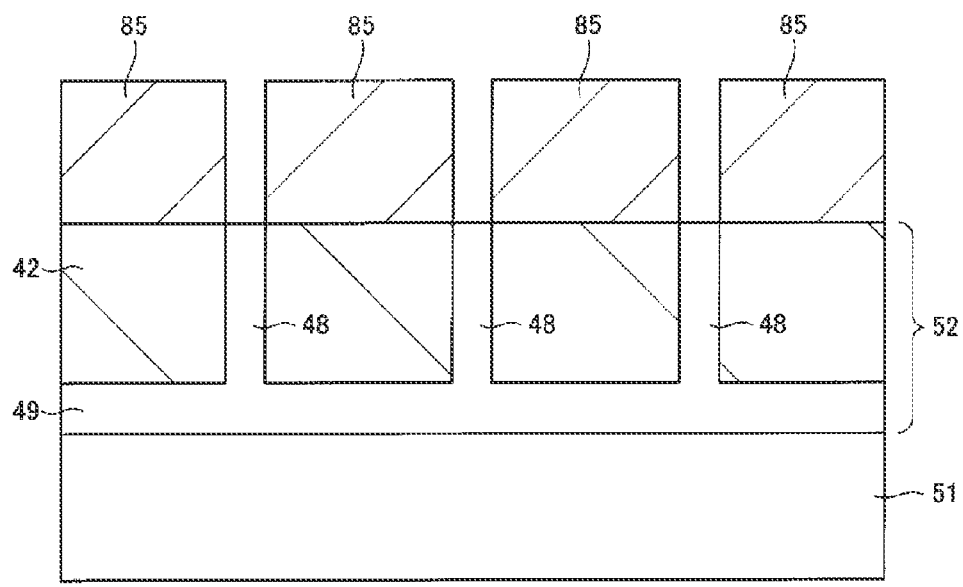
FIG. 19 is a fabrication process diagram for a solid-state image device according to the second embodiment.

Next, as illustrated in FIG. 19, photolithography resist patterning is conducted to form a resist layer 85. The resist layer 85 is formed in a pattern with openings exposing the area above the p-type semiconductor regions 48 that will become the isolation regions.

Figure 20:
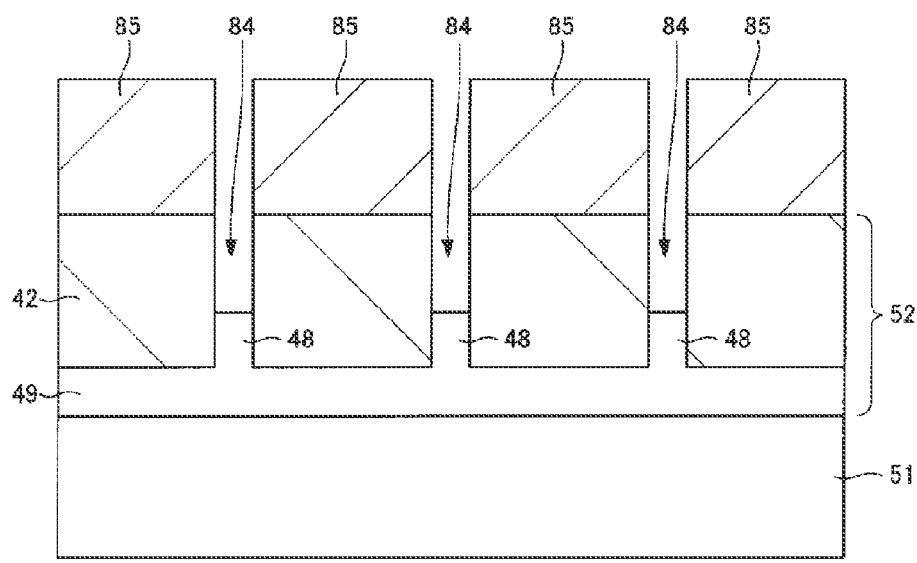
FIG. 20 is a fabrication process diagram for a solid-state image device according to the second embodiment.

Then, as illustrated in FIG. 20, the p-type semiconductor regions 48 are dry-etched through the openings in the resist layer 85, thus forming trenches 84 in the semiconductor substrate 52.

Figure 21:
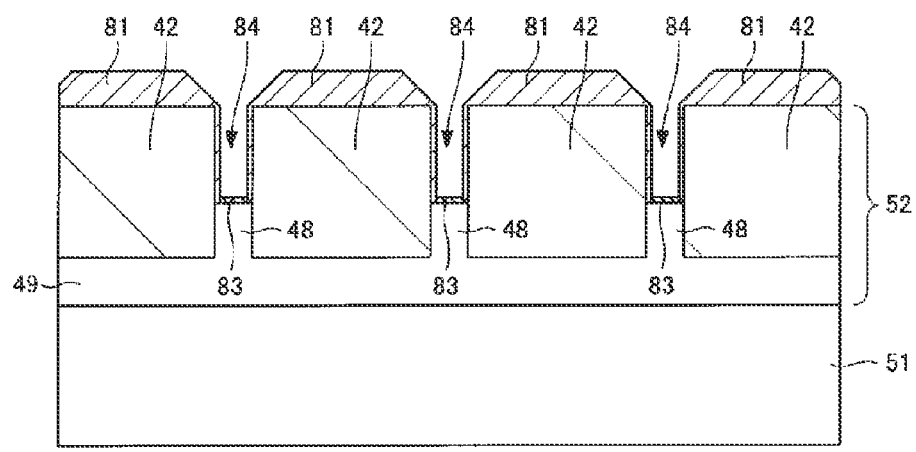
FIG. 21 is a fabrication process diagram for a solid-state image device according to the second embodiment.

Next, as illustrated in FIG. 21, a semiconductor layer 81 is formed by epitaxial growth over the entire surface of the semiconductor substrate 52, including the inner surface of the trenches 84. The amount of precursor gas supplied inside the trenches 84 for use in epitaxial growth becomes less than at the top surface of the semiconductor substrate 52. For this reason, the semiconductor layer 81 formed inside the trenches 84 is thinner than that at the top surface of the semiconductor substrate 52.

In addition, p-type impurities are ion-implanted into the semiconductor layer 81 formed on the floor of the trenches 84. With this process, p-type diffusion regions 83 are formed which block connections between sections of the semiconductor layer 81 in adjacent pixels.

The epitaxial growth of the semiconductor layer 81 may be conducted under similar conditions as in the first embodiment discussed earlier.

Figure 22:
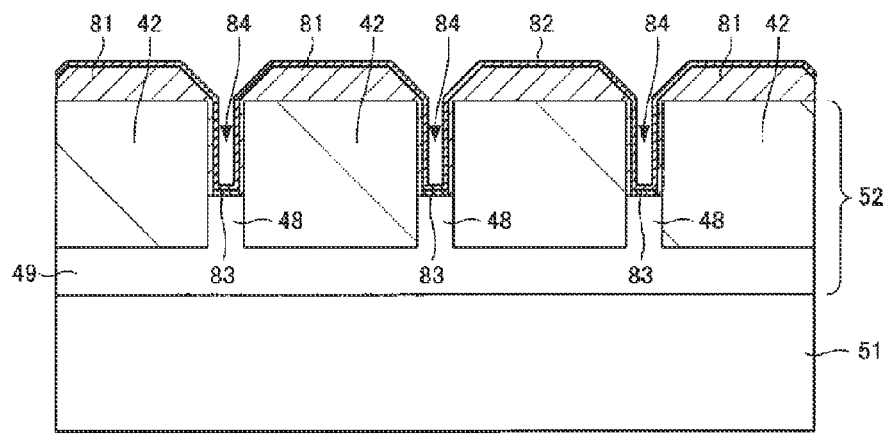
FIG. 22 is a fabrication process diagram for a solid-state image device according to the second embodiment.

Next, as illustrated in FIG. 22, an insulating layer 82 is formed on top of the semiconductor layer 81. The insulating layer 82 is formed contiguously from the surface of the semiconductor layer 81 formed on the second face of the semiconductor substrate 52 to the surface of the semiconductor layer 81 inside the trenches 84. By forming an insulating layer 82 on top of the semiconductor layer 81 with a film having a fixed negative charge, a p-type semiconductor layer is formed on the surface of the semiconductor layer 81, thereby forming a hole-accumulated diode (HAD) structure.

Thereafter, the solid-state image device in this example may be fabricated according to a method similar to FIG. 11 and thereafter in the first embodiment.

<5. Third Embodiment of Solid-State Image Device>

Next, a third embodiment of a solid-state image device will be described. The third embodiment has a similar configuration as the second embodiment, with the exception of light shielding units being formed inside the trenches that will become the grid pattern. For this reason, in the following description of the third embodiment, parts of the configuration that are similar to the second embodiment will be omitted from description.

Figure 23:
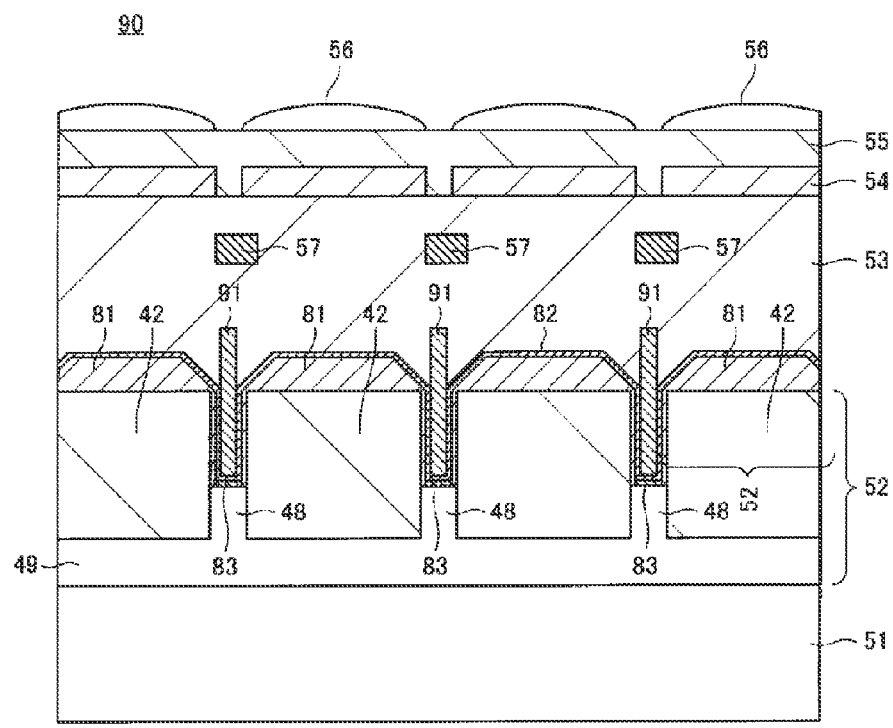
FIG. 23 is a cross-section view illustrating a configuration of a solid-state image device according to the third embodiment.

FIG. 23 illustrates a configuration of a solid-state image device according to the third embodiment. FIG. 23 is a diagram illustrating a cross-sectional configuration taken along the line A in FIG. 2.

As illustrated in FIG. 23, in a solid-state image device according to the third embodiment, the trenches that are included in a grid pattern are filled by light shielding units 91.

The trenches formed in the semiconductor substrate 52 have a similar configuration to those of the second embodiment discussed above. The semiconductor layer 81 and the insulating layer 82 formed inside the trenches are also similar to those of the second embodiment discussed above.

The light shielding units 91 are formed on top of the insulating layer 82 formed inside the trenches. Additionally, the light shielding units 91 are formed rising from the trench floor to a higher position than the semiconductor layer 81. The light shielding units 91 may be formed from a material such as Al, Ti, or W, for example.

By providing the light shielding units 91, it is possible to block diagonally incident light between adjacent pixels. For example, it is possible to block diagonally incident light that is transmitted through the semiconductor layer 81 on the top of the semiconductor substrate 52 and incident on the semiconductor layer 81 trench wall of an adjacent pixel. For this reason, it is possible to prevent color bleeding between adjacent pixels. This configuration is particularly effective at preventing color bleeding due to diagonally incident light when combined with the light shielding film 57 formed in the interlayer film 53.

<6. Method of Fabricating Solid-State Image Device According to Third Embodiment>

Next, a method of fabricating a solid-state image device according to the third embodiment discussed above will be described. FIGS. 24 to 28 are fabrication process diagrams for a solid-state image device according to the third embodiment, and more particularly, are diagrams illustrating fabrication processes for regions where photoelectric transducers are formed. Note that FIGS. 25 to 28 are diagrams illustrating a cross-sectional configuration taken along the line A in FIG. 2.

Figure 24:
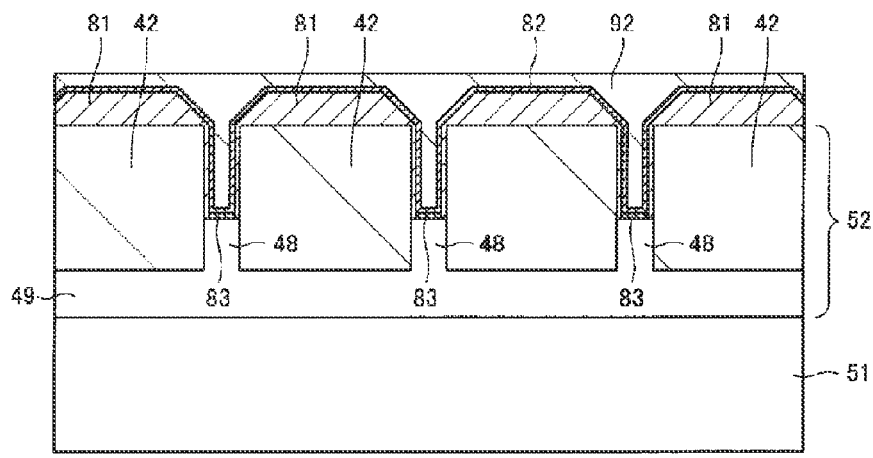
FIG. 24 is a fabrication process diagram for a solid-state image device according to the third embodiment.

First, the fabrication method of the second embodiment discussed earlier is conducted, up to the process of forming the insulating layer 82 illustrated in FIG. 22. Then, as illustrated in FIG. 24, a mask layer 92 made of a material such as SiO₂ is formed covering the insulating layer 82. After being formed over the entire surface of the semiconductor substrate 52, including inside the trenches, the top of the mask layer 92 is planarized by a technique such as chemical mechanical polishing (CMP).

Figure 25:
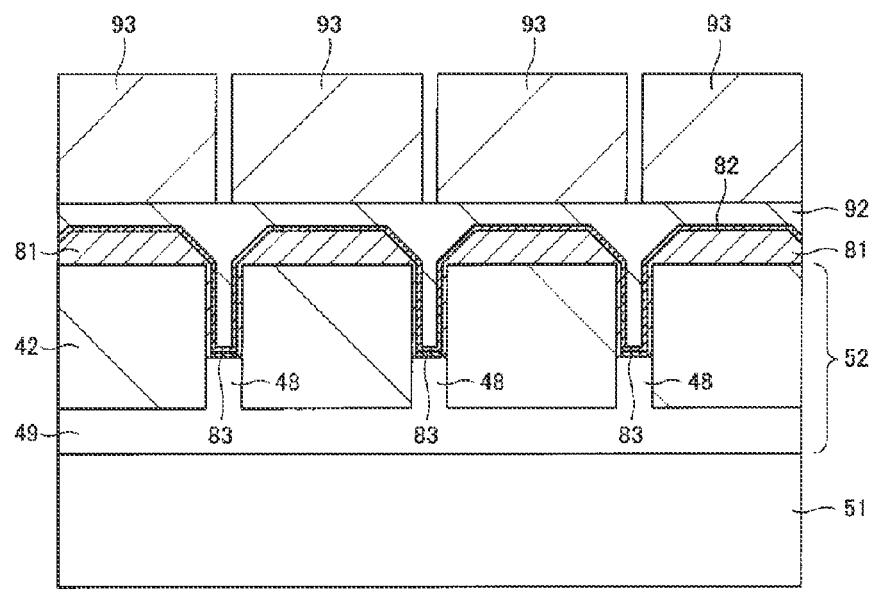
FIG. 25 is a fabrication process diagram for a solid-state image device according to the third embodiment.

Next, as illustrated in FIG. 25, photolithography resist patterning is conducted to form a resist layer 93. The resist layer 93 is formed in a pattern with openings exposing the area above the p-type semiconductor regions 48 that will become the isolation regions. Thus, a pattern is formed with openings exposing the regions where the light shielding units 91 will be formed, or in other words, the regions where trenches will be formed.

Figure 26:
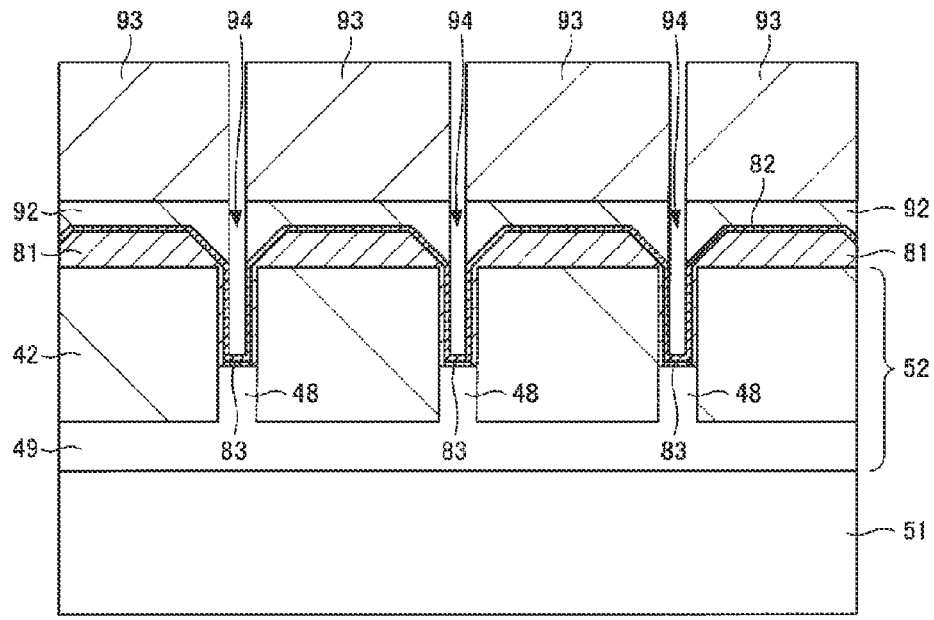
FIG. 26 is a fabrication process diagram for a solid-state image device according to the third embodiment.

Next, as illustrated in FIG. 26, the mask layer 92 is removed by dry etching, with the resist layer 93 as a mask. The etching of the mask layer 92 is conducted with a method having high selectivity between the mask layer 92 and the insulating layer 82. Thus, trenches 94 are formed from the top of the mask layer 92 to the top of the insulating layer 82 at the trench floors in the semiconductor substrate 52.

Figure 27:
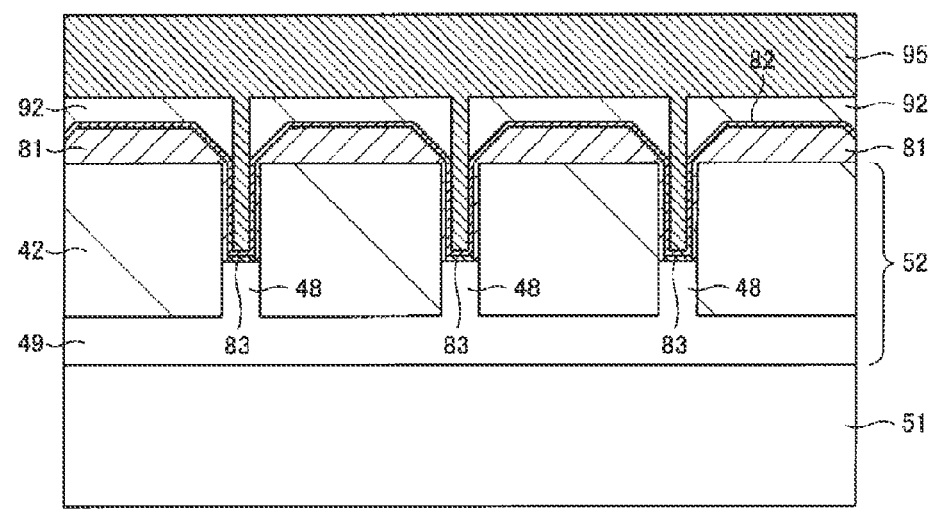
FIG. 27 is a fabrication process diagram for a solid-state image device according to the third embodiment.
Figure 28:
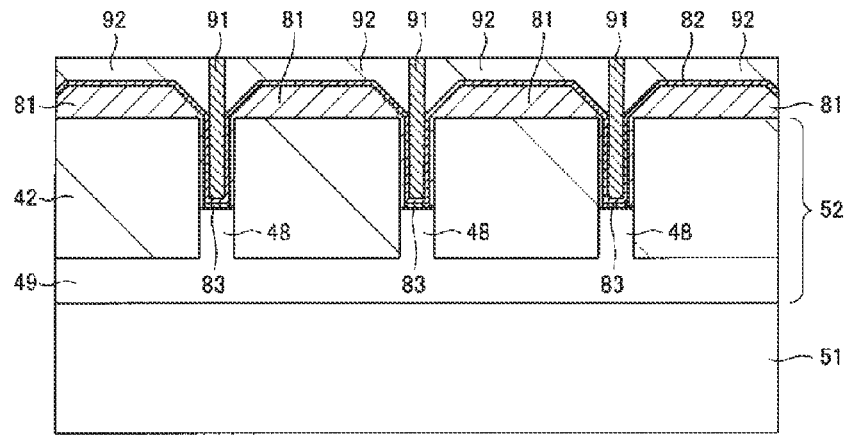
FIG. 28 is a fabrication process diagram for a solid-state image device according to the third embodiment.

Next, after removing the resist layer 93, a light-shielding material layer 95 is formed inside the trenches 94 and on top of the mask layer 92, as illustrated in FIG. 27. Then, as illustrated in FIG. 28, CMP or another technique is used to polish the light-shielding material layer 95 down to a position exposing the mask layer 92. Thus, it is possible to form light shielding units 91. Also, by additionally polishing the light shielding units 91 and the mask layer 92 in this state, it is possible to form light shielding units 96 of desired height.

Thereafter, the solid-state image device in this example may be fabricated according to a method similar to FIG. 11 and thereafter in the first embodiment.

Figure 29:
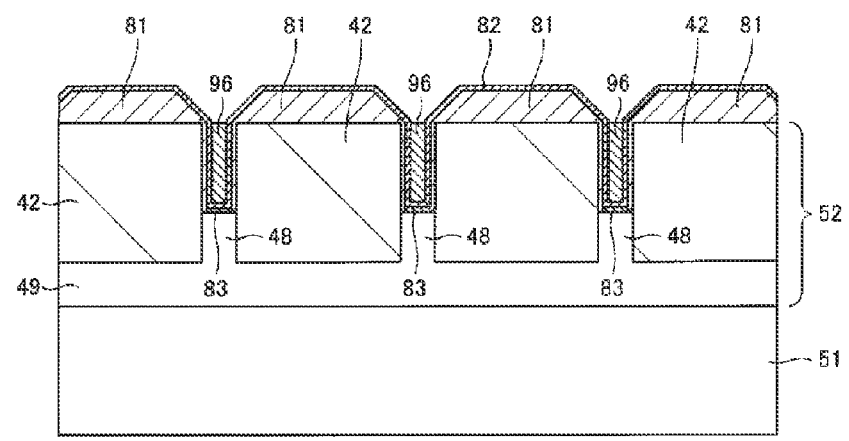
FIG. 29 is a fabrication process diagram for a solid-state image device according to the third embodiment.

Note that in the above fabrication method, CMP by itself may be insufficient to polish the light shielding units 91 down to a position lower than the semiconductor layer 81 and the insulating layer 82. For this reason, when it is desirable to form the light shielding units 91 at a lower position, the light shielding units 91 may be first polished down to the state in FIG. 28 by CMP, and then additionally wet-etched, for example. With wet etching, the light shielding units 91 are removed down to a given height. By subsequently removing the hard mask layer (SiO₂), it is possible to form light shielding units 96 formed down to a position lower than the semiconductor layer 81 as illustrated in FIG. 29. In this way, light shielding units 91 having a height at an arbitrary position may be formed.

<7. Electronic Apparatus>

Next, an embodiment of an electronic apparatus equipped with the foregoing solid-state image device will be described.

Figure 30:
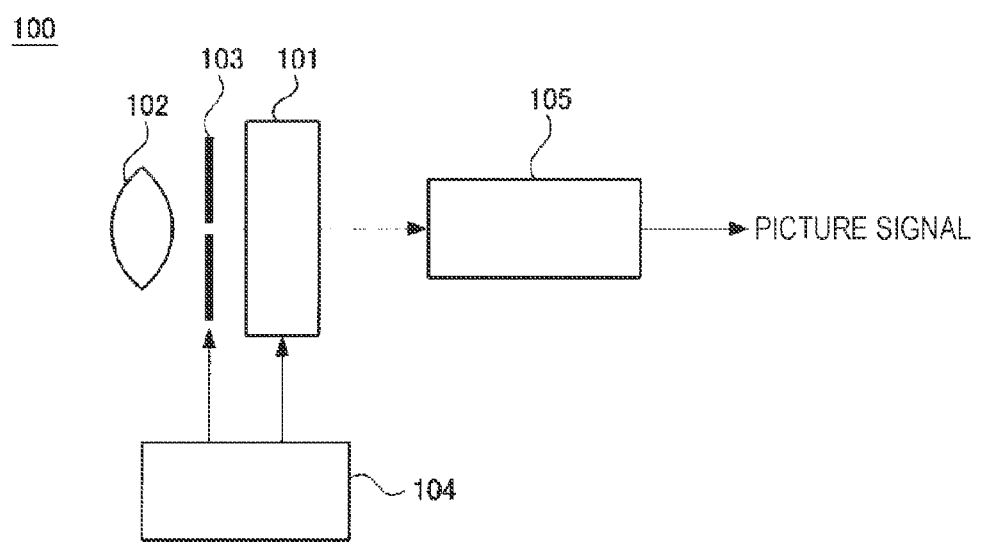
FIG. 30 is a diagram illustrating a configuration of an electronic apparatus.

The foregoing solid-state image device may be applied to an electronic apparatus such as a digital camera, video camera, or other camera system, a mobile phone with imaging functionality, or another device equipped with imaging functionality, for example. FIG. 30 depicts an example of such an electronic apparatus, illustrating a diagrammatic configuration for the case of applying a solid-state image device to a camera able to take still images or video.

The camera 100 in this example is equipped with a solid-state image device 101, optics 102 that guide incident light to the photosensor portion of the solid-state image device 101, a shutter 103 provided between the solid-state image device 101 and the optics 102, and a driving circuit 104 that drives the solid-state image device 101. In addition, the camera 100 is equipped with a signal processing circuit 105 that processes output signals from the solid-state image device 101.

A solid-state image device according to the respective foregoing embodiments and modification may be applied to the solid-state image device 101. The optics (optical lens) 102 focuses image light (incident light) from a subject onto the imaging surface of the solid-state image device 101 (not illustrated). Thus, signal charges accumulate inside the solid-state image device 101 for a fixed period. Note that the optics 102 may also be configured as an optical lens group that includes multiple optical lenses. The shutter 103 controls the periods during which the solid-state image device 101 is irradiated by, or shielded from, incident light.

The driving circuit 104 supplies driving signals to the solid-state image device 101 and the shutter 103. With the supplied driving signals, the driving circuit 104 controls the output of signals from the solid-state image device 101 to the signal processing circuit 105, as well as the shutter operation of the shutter 103. In other words, in this example, signals are transferred from the solid-state image device 101 to the signal processing circuit 105 according to a driving signal (timing signal) supplied from the driving circuit 104.

The signal processing circuit 105 performs various signal processing on a signal transferred from the solid-state image device 101. The processed signal (picture signal) is then stored in memory or other storage medium (not illustrated), or alternatively, output to a monitor (not illustrated).

According to an electronic apparatus such as the above camera 100, it is possible to provide an electronic apparatus with improved image quality due to the excellent transfer efficiency of signal charges from the photoelectric transducer film in the solid-state image device 101.

Note that peripheral circuits in the second and third embodiments may be configured similarly to those in the first embodiment.

Also, in the foregoing second and third embodiments, instead of forming a film having a fixed negative charge, a p-type semiconductor layer may be formed on the surface of the semiconductor layer 81 by in-situ doped epitaxial growth, as in the foregoing modification of the first embodiment. In such a case, the peripheral circuits may be configured similarly to those in the modification of the first embodiment.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A solid-state image device, including:
a semiconductor substrate;
a circuit formed on a first face of the semiconductor substrate;
a grid pattern provided on a second face of the semiconductor substrate; and
a semiconductor layer formed within the grid pattern and having a shape whose cross-sectional surface area in a plane parallel to a surface of the semiconductor substrate decreases with increasing distance from the semiconductor substrate.

(2) The solid-state image device according to (1), wherein
a p-type semiconductor layer is formed on the surface of the semiconductor layer.

(3) The solid-state image device according to (2), wherein
the p-type semiconductor layer is formed by a film having a fixed negative charge that covers the semiconductor layer.

(4) The solid-state image device according to (2), wherein
the p-type semiconductor layer is formed by adding a p-type impurity.

(5) The solid-state image device according to any one of (1) to (4), wherein
the grid pattern is realized by an insulating layer formed over the semiconductor substrate.

(6) The solid-state image device according to any one of (1) to (5), wherein
the grid pattern is formed over an isolation region between pixels.

(7) The solid-state image device according to (6), wherein
a width of the grid pattern is less than a width of the isolation region between pixels.

(8) The solid-state image device according to any one of (1) to (5), wherein
the grid pattern is a trench formed in the isolation region of the semiconductor substrate.

(9) The solid-state image device according to (8), wherein
a light shielding unit is formed inside the trench.

(10) The solid-state image device according to (8), wherein
the semiconductor layer is formed on an inner surface of the trench, and a diffusion layer of a p-type impurity is formed in a portion of the semiconductor layer inside the trench.

(11) The solid-state image device according to any one of (1) to (10), wherein
the semiconductor layer is an epitaxially grown layer.

(12) The solid-state image device according to any one of (1) to (11), wherein
the semiconductor layer is at least one or more selected from the group consisting of Ge, $Si_{1-x}Ge_x$ (where 0<x<1), InGaAs, GaAs, InP, InSb, SiGe, and a semiconductor layer with a chalcopyrite structure.

(13) A method of fabricating a solid-state image device, including:
forming a circuit on a first face of a semiconductor substrate;
forming a grid pattern on a second face of the semiconductor substrate; and
epitaxially growing a semiconductor layer within the grid pattern, the semiconductor layer having a shape whose cross-sectional surface area in a plane parallel to a surface of the semiconductor substrate decreases with increasing distance from the semiconductor substrate.

(14) An electronic apparatus, including:
the solid-state image device according to any one of (1) to (12); and
a signal processing circuit that processes an output signal from the solid-state image device.

The present disclosure contains subject matter related to that disclosed in Japanese Priority Patent Application JP 2012-085602 filed in the Japan Patent Office on Apr. 4, 2012, the entire content of which is hereby incorporated by reference.

What is claimed is:

1. A solid-state image device, comprising:
a semiconductor substrate;
a circuit formed on a first face of the semiconductor substrate;
pixels;
a grid pattern provided on a second face of the semiconductor substrate;
an isolation region in-between the pixels; and
a semiconductor layer formed within the grid pattern and having a shape whose cross-sectional surface area in a plane parallel to a surface of the semiconductor substrate decreases with increasing distance from the semiconductor substrate,
wherein,
the grid pattern is formed over the isolation region between the pixels.

2. The solid-state image device according to claim 1, wherein a p-type semiconductor layer is formed on the surface of the semiconductor layer.

3. The solid-state image device according to claim 2, wherein the p-type semiconductor layer is comprised of a film having a fixed negative charge that covers the semiconductor layer.

4. The solid-state image device according to claim 2, wherein the p-type semiconductor layer includes a p-type impurity.

5. The solid-state image device according to claim 1, wherein the grid pattern is comprised of an insulating layer formed over the semiconductor substrate.

6. The solid-state image device according to claim 1, wherein a width of the grid pattern is less than a width of the isolation region between pixels.

7. The solid-state image device according to claim 1, wherein the grid pattern is a trench in the isolation region of the semiconductor substrate.

8. The solid-state image device according to claim 7, wherein a light shielding unit is inside the trench.

9. The solid-state image device according to claim 7, wherein the semiconductor layer is on an inner surface of the trench, and a diffusion layer of a p-type impurity is in a portion of the semiconductor layer inside the trench.

10. The solid-state image device according to claim 1, wherein the semiconductor layer is an epitaxially grown layer.

11. The solid-state image device according to claim 1, wherein the semiconductor layer is at least one or more selected from the group consisting of Ge, $Si_{1-x}Ge_x$ (where 0<x<1), InGaAs, GaAs, InP, InSb, SiGe, and a semiconductor layer with a chalcopyrite structure.

12. A method of fabricating a solid-state image device, comprising:
   forming a circuit on a first face of a semiconductor substrate;
   providing pixels;
   forming a grid pattern on a second face of the semiconductor substrate;
   providing isolation regions in-between the pixels; and
   epitaxially growing a semiconductor layer within the grid pattern, the semiconductor layer having a shape whose cross-sectional surface area in a plane parallel to a surface of the semiconductor substrate decreases with increasing distance from the semiconductor substrate,
wherein,
   the grid pattern is formed over the isolation region between the pixels.

13. An electronic apparatus, comprising:
a solid-state image device that includes
   (a) a semiconductor substrate,
   (b) a circuit formed on a first face of the semiconductor substrate,
   (c) pixels,
   (d) an isolation region between the pixels,
   (e) a grid pattern provided on a second face of the semiconductor substrate, and
   a semiconductor layer formed within the grid pattern and having a shape whose cross-sectional surface area in a plane parallel to a surface of the semiconductor substrate decreases with increasing distance from the semiconductor substrate; and
a signal processing circuit that processes an output signal from the solid-state image device,
wherein,
the grid pattern is formed over the isolation region between the pixels.

* * * * *